United States Patent
Hwang et al.

(10) Patent No.: US 11,538,913 B2
(45) Date of Patent: *Dec. 27, 2022

(54) SEMICONDUCTOR DEVICE HAVING SILICIDES AND METHODS OF MANUFACTURING THE SAME

(71) Applicant: Samsung Electronics Co., Ltd., Suwon-si (KR)

(72) Inventors: Inchan Hwang, Siheung-si (KR); Heonjong Shin, Yongin-si (KR); Sunghun Jung, Suwon-si (KR); Doohyun Lee, Hwaseong-si (KR); Hwichan Jun, Yongin-si (KR); Hakyoon Ahn, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 62 days.

This patent is subject to a terminal disclaimer.

(21) Appl. No.: 17/175,850

(22) Filed: Feb. 15, 2021

(65) Prior Publication Data

US 2021/0193808 A1 Jun. 24, 2021

Related U.S. Application Data

(63) Continuation of application No. 16/014,496, filed on Jun. 21, 2018, now Pat. No. 10,964,791.

(30) Foreign Application Priority Data

Nov. 17, 2017 (KR) .................... 10-2017-0154283

(51) Int. Cl.
*H01L 29/417* (2006.01)
*H01L 29/423* (2006.01)
(Continued)

(52) U.S. Cl.
CPC .. *H01L 29/41791* (2013.01); *H01L 21/28518* (2013.01); *H01L 21/823821* (2013.01);
(Continued)

(58) Field of Classification Search
CPC ......... H01L 29/41791; H01L 21/28518; H01L 21/823821; H01L 27/0924; H01L 29/0653
See application file for complete search history.

(56) References Cited

U.S. PATENT DOCUMENTS 8,362,574 B2   1/2013 Kawasaki et al.
9,214,556 B2  12/2015 Wann et al.
(Continued)

FOREIGN PATENT DOCUMENTS

CN    105762148 A    7/2016
KR    10-0630769 B1    9/2006
(Continued)

OTHER PUBLICATIONS

Notice of Allowance dated Nov. 13, 2021 in U.S. Appl. No. 16/014,496.
(Continued)

*Primary Examiner* — Bac H Au
(74) *Attorney, Agent, or Firm* — Harness, Dickey & Pierce, P.L.C.

(57) ABSTRACT

A semiconductor device is disclosed. The semiconductor device may include a substrate including a first active pattern, the first active pattern vertically protruding from a top surface of the substrate, a first source/drain pattern filling a first recess, which is formed in an upper portion of the first active pattern, a first metal silicide layer on the first source/drain pattern, the first metal silicide layer including a first portion and a second portion, which are located on a first surface of the first source/drain pattern, and a first contact in contact with the second portion of the first metal silicide
(Continued)

layer. A thickness of the first portion may be different from a thickness of the second portion.

20 Claims, 38 Drawing Sheets

(51) Int. Cl.

| | | |
|---|---|---|
| H01L 29/45 | (2006.01) | |
| H01L 21/285 | (2006.01) | |
| H01L 29/06 | (2006.01) | |
| H01L 27/092 | (2006.01) | |
| H01L 29/08 | (2006.01) | |
| H01L 21/8238 | (2006.01) | |
| H01L 29/165 | (2006.01) | |
| H01L 29/78 | (2006.01) | |
| H01L 29/66 | (2006.01) | |

(52) U.S. Cl.
CPC ...... *H01L 27/0924* (2013.01); *H01L 29/0653* (2013.01); *H01L 29/0847* (2013.01); *H01L 29/165* (2013.01); *H01L 29/4232* (2013.01); *H01L 29/45* (2013.01); *H01L 29/7853* (2013.01); *H01L 29/6656* (2013.01)

(56) References Cited

U.S. PATENT DOCUMENTS

| | | | |
|---|---|---|---|
| 9,397,098 B2 | 7/2016 | Lin et al. | |
| 9,595,524 B2 | 3/2017 | Anderson et al. | |
| 9,704,744 B2 | 7/2017 | Leib et al. | |
| 9,704,865 B2 | 7/2017 | Lee et al. | |
| 9,876,016 B2 | 1/2018 | Steigerwald et al. | |
| 10,068,774 B2* | 9/2018 | Huang | H01L 21/76895 |
| 10,964,791 B2* | 3/2021 | Hwang | H01L 29/0653 |
| 2014/0203370 A1 | 7/2014 | Maeda et al. | |
| 2015/0214105 A1* | 7/2015 | Zhang | H01L 29/456 |
| | | | 438/655 |
| 2016/0197074 A1 | 7/2016 | Lee et al. | |
| 2016/0233164 A1 | 8/2016 | Choi et al. | |
| 2016/0322304 A1 | 11/2016 | Kim et al. | |
| 2016/0372596 A1 | 12/2016 | Gluschenkov et al. | |
| 2017/0148797 A1 | 5/2017 | Kim et al. | |
| 2017/0207095 A1* | 7/2017 | Lee | H01L 29/66795 |
| 2017/0243760 A1 | 8/2017 | Chao et al. | |
| 2017/0294508 A1* | 10/2017 | Hsu | H01L 29/0847 |
| 2020/0020583 A1* | 1/2020 | Chao | H01L 23/535 |
| 2020/0105535 A1* | 4/2020 | Lin | H01L 21/28518 |
| 2022/0051948 A1* | 2/2022 | More | H01L 29/7851 |

FOREIGN PATENT DOCUMENTS

| | | |
|---|---|---|
| KR | 10-2016-0098193 A | 8/2016 |
| KR | 10-1675121 B1 | 11/2016 |
| KR | 10-1792086 B1 | 11/2017 |

OTHER PUBLICATIONS

Notice of Allowance dated Dec. 18, 2021 in U.S. Appl. No. 16/014,496.

* cited by examiner

SEMICONDUCTOR DEVICE HAVING SILICIDES AND METHODS OF MANUFACTURING THE SAME

CROSS-REFERENCE TO RELATED APPLICATIONS

The present application is a continuation of and claims priority under 35 U.S.C. § 120 to U.S. patent application Ser. No. 16/014,496, filed on Jun. 21, 2018, which hereby claims priority under 35 U.S.C. § 119 to Korean Patent Application No. 10-2017-0154283, filed on Nov. 17, 2017, in the Korean Intellectual Property Office, the entire contents of which are hereby incorporated by reference.

BACKGROUND

The present disclosure relates to a semiconductor device, and in particular, to a semiconductor device including field effect transistors.

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with faster speed and/or lower power consumption, it is advantageous to realize semiconductor devices with higher reliability, higher performance, and/or multiple functions. To satisfy these technical requirements, complexity and/or integration density of semiconductor devices are being increased.

SUMMARY

Some example embodiments of the inventive concepts provide a semiconductor device with improved electric characteristics and/or an increased operation speed.

According to some example embodiments of the inventive concepts, a semiconductor device may include a substrate including a first active pattern, the first active pattern vertically protruding from a top surface of the substrate, a first source/drain pattern filling a first recess, which is formed in an upper portion of the first active pattern, a first metal silicide layer on the first source/drain pattern, the first metal silicide layer including a first portion and a second portion, which are located on a first surface of the first source/drain pattern, and a first contact in contact with the second portion of the first metal silicide layer. A thickness of the first portion may be different from a thickness of the second portion.

According to some example embodiments of the inventive concepts, a semiconductor device may include a substrate including a first active pattern, the first active pattern vertically protruding from a top surface of the substrate, a first source/drain pattern filling a first recess, which is formed in an upper portion of the first active pattern, a first metal silicide layer on the first source/drain pattern, a first contact electrically connected to the first source/drain pattern through the first metal silicide layer, and an etch stop layer covering a first portion of the first metal silicide layer. The first contact may cover a second portion of the first metal silicide layer, and a thickness of the first portion may be different from a thickness of the second portion.

According to some example embodiments of the inventive concepts, a semiconductor device may include a substrate with a PMOSFET region and an NMOSFET region, a first active pattern and a second active pattern provided on the PMOSFET and NMOSFET regions, respectively, a first source/drain pattern and a second source/drain pattern provided in upper portions of the first and second active patterns, a first metal silicide layer and a second metal silicide layer provided on the first and second source/drain patterns, respectively, and first and second contacts in contact with the first and second metal silicide layers, respectively. A thickness of a first portion of the first metal silicide layer interposed between the first contact and the first source/drain pattern may be different from a thickness of a first portion of the second metal silicide layer interposed between the second contact and the second source/drain pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or
} properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
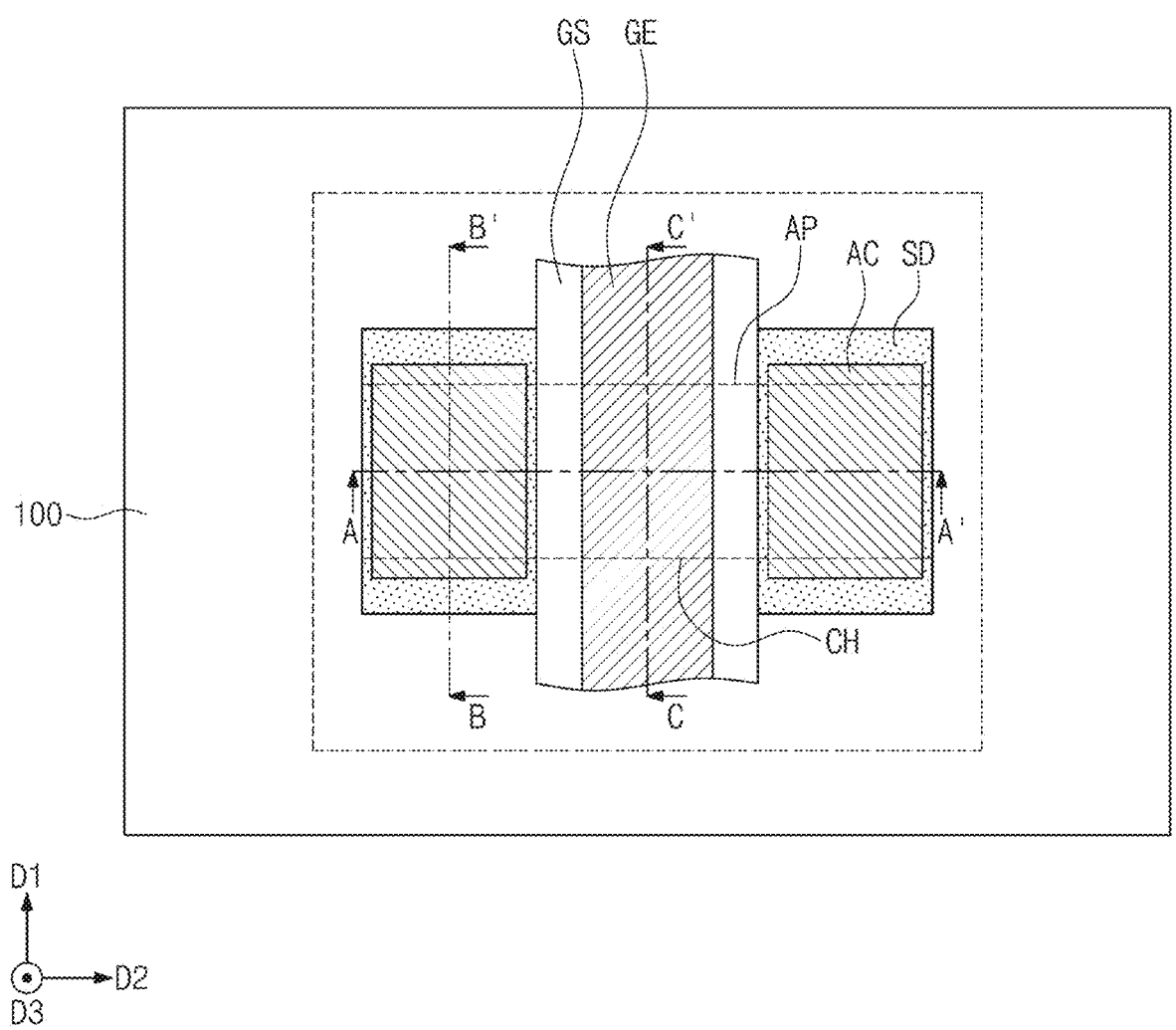
FIG. 1 is a plan view illustrating a semiconductor device according to some example embodiments of the inventive concepts.
Figure 2A:
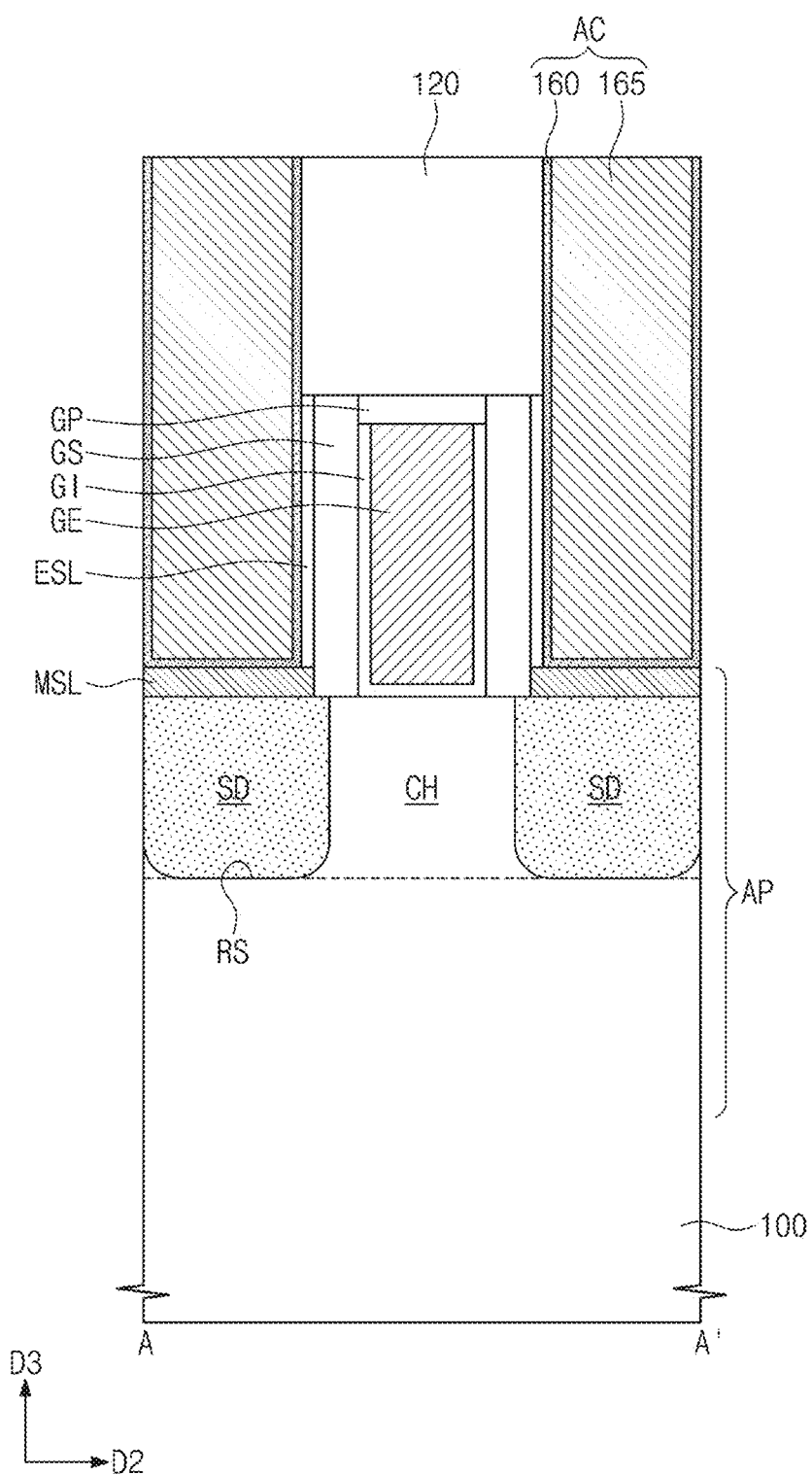
FIGS. 2A to 2C are sectional views taken along lines A-A', B-B', and C-C', respectively, of FIG. 1.
Figure 2B:
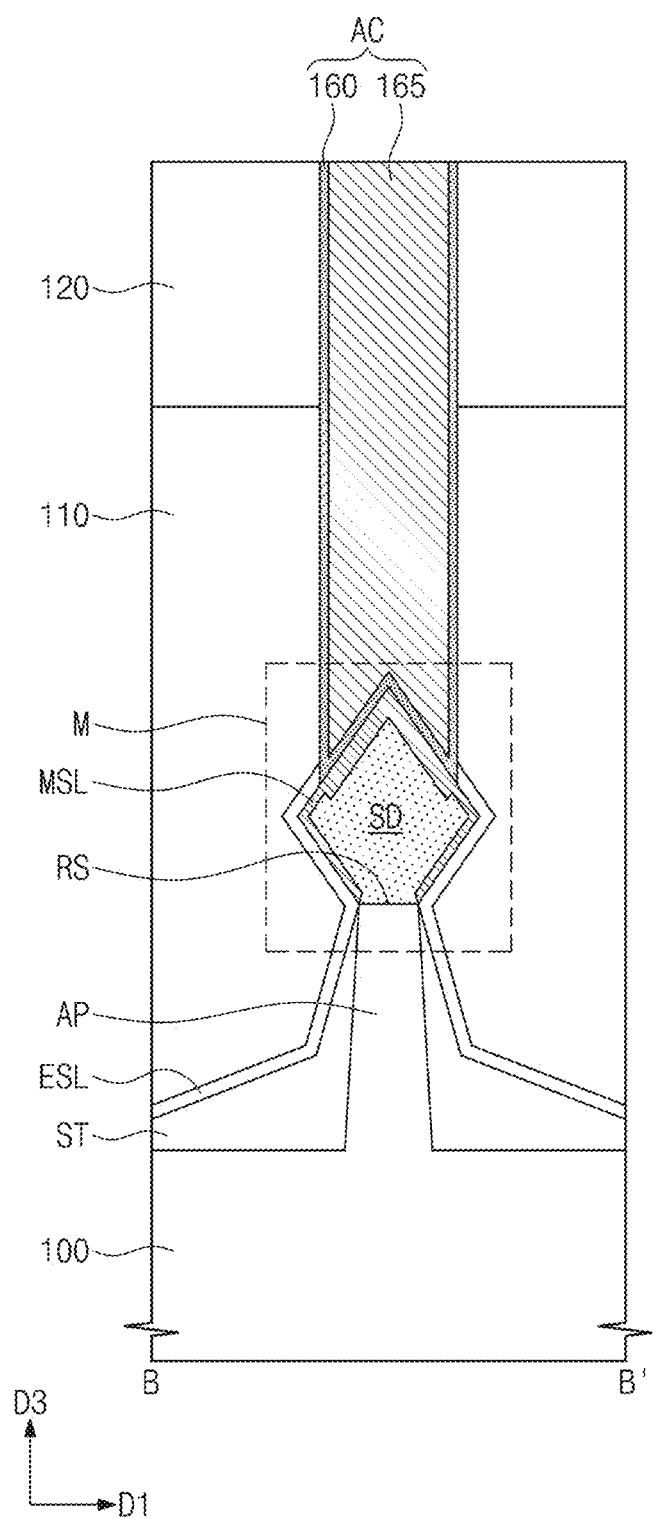
Figure 2C:
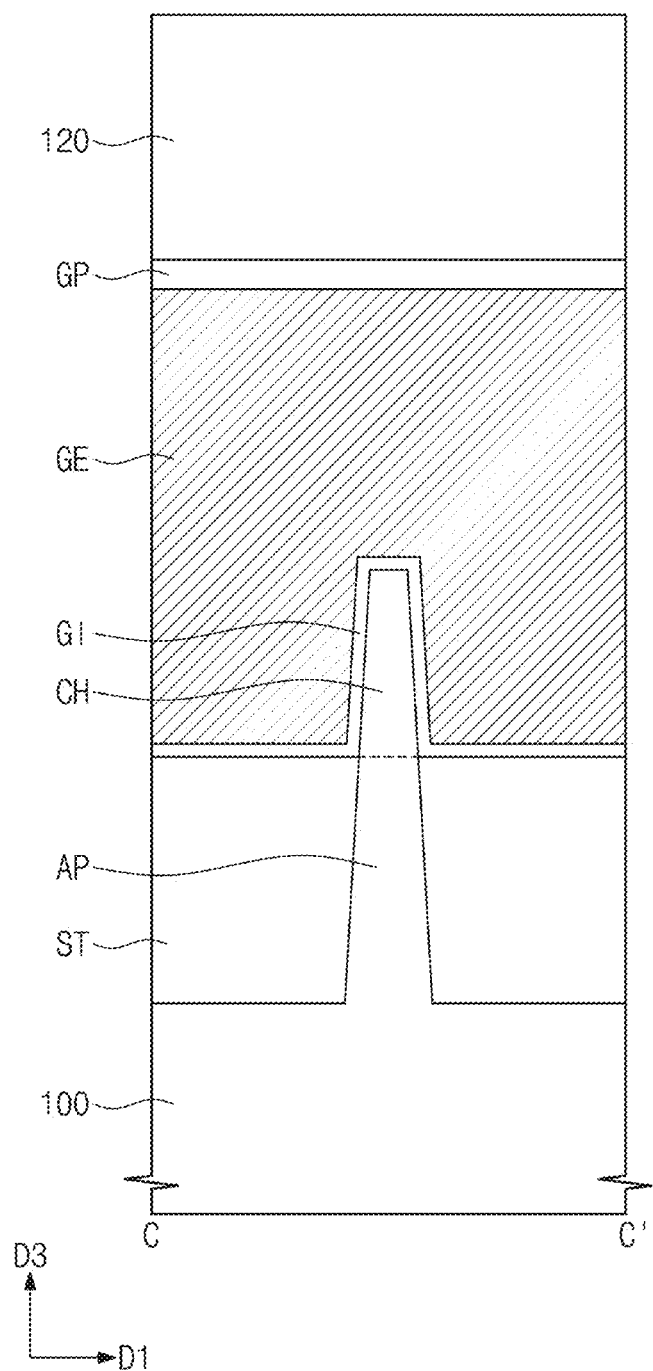
Figure 3:
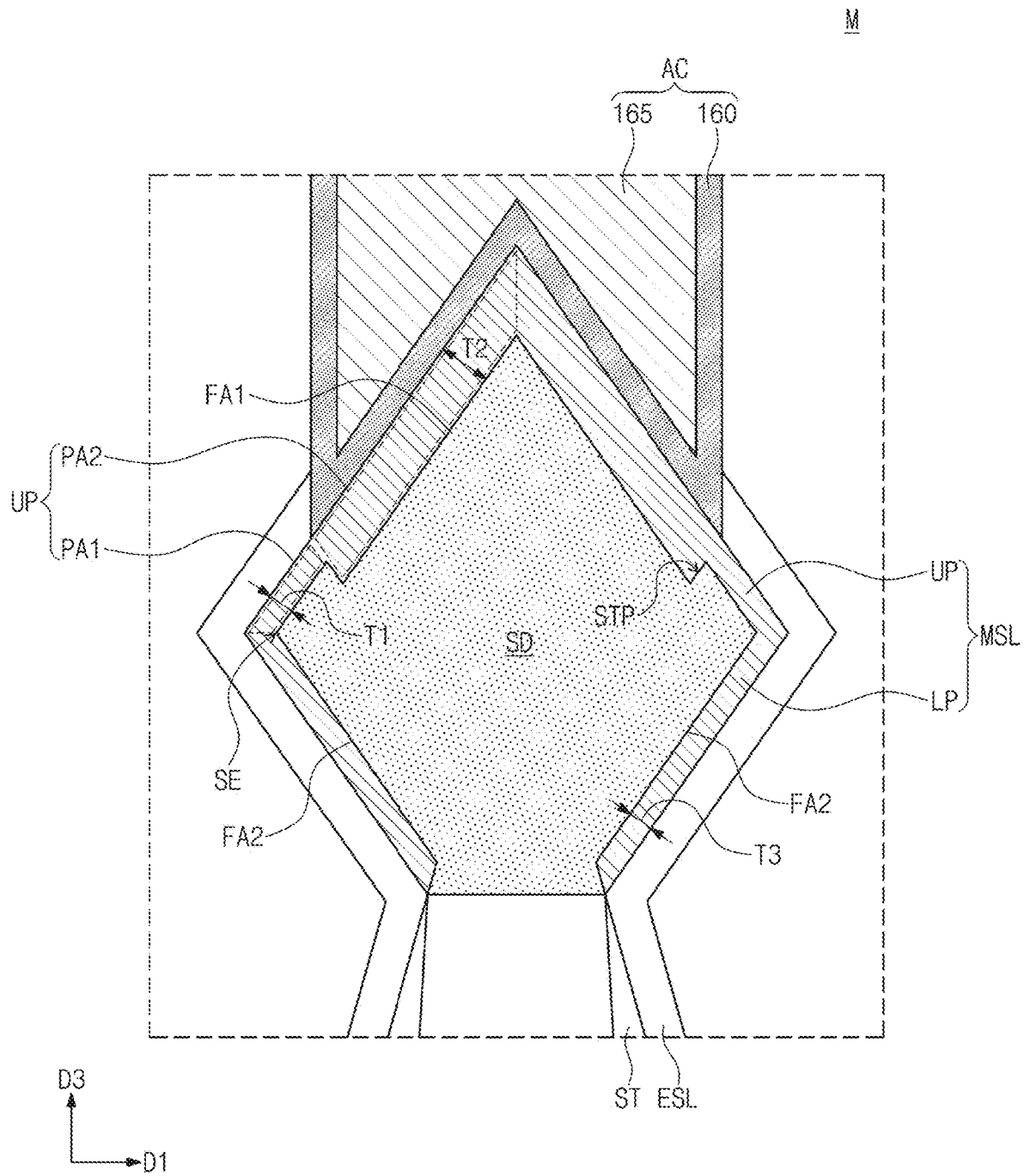
FIG. 3 is an enlarge sectional view of a portion 'M' of FIG. 2B.

FIG. 1 is a plan view illustrating a semiconductor device according to some example embodiments of the inventive concepts. FIGS. 2A to 2C are sectional views taken along lines A-A', B-B', and C-C', respectively, of FIG. 1. FIG. 3 is an enlarge sectional view of a portion 'M' of FIG. 2B.

Referring to FIGS. 1, 2A to 2C, and 3, a substrate 100 with a first region RG1 may be provided. The substrate 100 may be a semiconductor substrate (e.g., of silicon, germanium, or silicon-germanium) or a compound semiconductor substrate. As an example, the substrate 100 may be a silicon wafer.

The first region RG1 may be a part of a logic cell region, on which logic transistors constituting a logic circuit of a semiconductor device are integrated. As an example, logic transistors constituting a processor core or I/O terminals may be provided on the logic cell region of the substrate 100. The first region RG1 may include at least one of the logic transistors.

In certain example embodiments, the first region RG1 may be a part of a memory cell region, which is used to store data. As an example, memory cell transistors constituting a plurality of SRAM cells may be provided on the memory cell region of the substrate 100. The first region RG1 may include at least one of the memory cell transistors. However, the inventive concept is not limited thereto.

An active pattern AP extending in a second direction D2 may be provided on the first region RG1. The active pattern AP may be a portion of the substrate 100 (e.g., protruding from a top surface of the substrate 100). A device isolation layer ST may be provided in an upper portion of the substrate 100. The device isolation layer ST may be provided to define the active pattern AP. The device isolation layer ST may be provided to directly cover lower side surfaces of the active pattern AP. The device isolation layer ST may be formed of or include at least one of insulating materials (e.g., silicon oxide).

An upper portion of the active pattern AP may be located at a level higher than that of a top surface of the device isolation layer ST. The upper portion of the active pattern AP may extend in a vertical direction, thereby have a protruding shape relative to the device isolation layer ST. The upper portion of the active pattern AP may be a fin-shaped portion penetrating the device isolation layer ST.

A channel region CH and source/drain patterns SD may be provided in the upper portion of the active pattern AP. Recesses RS may be formed in the upper portion of the active pattern AP. The recesses RS may be vertically recessed to be located below the channel region CH. The source/drain patterns SD may be provided to fill the recesses RS. Each of the source/drain patterns SD may cover an inner side surface of the recess RS. As an example, the source/drain patterns SD may be p-type impurity regions. As another example, the source/drain patterns SD may be n-type impurity regions. The channel region CH may be interposed between a pair of the source/drain pattern SD.

The source/drain patterns SD may be epitaxial patterns, which are formed using a selective epitaxial growth process. The source/drain patterns SD may have top surfaces, which are located at a level that is equal to or higher than that of the channel region CH. The source/drain pattern SD may include a semiconductor material different from that of the substrate 100. As an example, the source/drain pattern SD may be formed of or include a semiconductor material whose lattice constant is greater than that of the substrate 100. In example embodiments, the source/drain pattern SD may exert a compressive stress to the channel region CH. As another example, the source/drain pattern SD may be formed of or include the same semiconductor material as that of the substrate 100.

A gate electrode GE may be provided to cross the active pattern AP and to extend in a first direction D1. The gate electrode GE may be overlapped with the channel region CH when viewed in a plan view. The gate electrode GE may be provided to face a top surface and opposite side surfaces of the channel region CH (e.g., see FIG. 2C). As an example, the gate electrode GE may be formed of or include at least one of conductive metal nitrides (e.g., titanium nitride or tantalum nitride) or metallic materials (e.g., titanium, tantalum, tungsten, copper, or aluminum).

A pair of gate spacers GS may be provided on opposite side surfaces of the gate electrode GE. The gate spacers GS may extend along the gate electrode GE or in the first direction D1. Top surfaces of the gate spacers GS may be higher than the top surface of the gate electrode GE. The top surfaces of the gate spacers GS may be coplanar with a top surface of a first interlayered insulating layer 110, which will be described below. The gate spacers GS may be formed of or include at least one of SiCN, SiCON, or SiN. As another example, each of the gate spacers GS may be provided to have a multi-layered structure including at least two of SiCN, SiCON, or SiN.

A gate dielectric pattern GI may be interposed between the gate electrode GE and the active pattern AP. The gate dielectric pattern GI may extend along the bottom surface of the gate electrode GE. The gate dielectric pattern GI may be provided to cover the top surface and opposite side surfaces of the channel region CH. The gate dielectric pattern GI may be formed of or include at least one of high-k dielectric materials. For example, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A gate capping pattern GP may be provided on the gate electrode GE. The gate capping pattern GP may extend along the gate electrode GE or in the first direction D1. The gate capping pattern GP may include a material having an etch selectivity with respect to the first interlayered insulating layer 110, which will be described below. For example, the gate capping patterns GP may be formed of or include at least one of SiON, SiCN, SiCON, or SiN.

The first interlayered insulating layer 110 may be provided on the substrate 100. The first interlayered insulating layer 110 may be provided to cover the gate spacers GS and the source/drain patterns SD. The first interlayered insulating layer 110 may have a top surface that is substantially coplanar with the top surface of the gate capping pattern GP and the top surfaces of the gate spacers GS. An etch stop layer ESL may be interposed between the gate spacers GS and the first interlayered insulating layer 110. The etch stop layer ESL may be provided to partially cover metal silicide layers MSL on the source/drain patterns SD. A second interlayered insulating layer 120 may be provided on the first interlayered insulating layer 110 to cover the gate capping patterns GP. As an example, the first and second interlayered insulating layers 110 and 120 may be formed of or include silicon oxide. The etch stop layer ESL may be formed of or include silicon nitride.

Contacts AC may be provided at both sides of the gate electrode GE to penetrate the first and second interlayered insulating layers 110 and 120 and to be electrically connected to the source/drain patterns SD. As an example, at least one of the contacts AC may be connected to a corresponding one of the source/drain patterns SD.

Each of the contacts AC may include a conductive pillar 165 and a barrier layer 160 enclosing the conductive pillar 165. The barrier layer 160 may be provided to cover side and bottom surfaces of the conductive pillar 165. The conductive pillar 165 may be formed of or include at least one of metallic materials (e.g., aluminum, copper, tungsten, molybdenum, or cobalt). The barrier layer 160 may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

The metal silicide layer MSL may be interposed between each of the source/drain patterns SD and a corresponding one of the contacts AC. The contact AC may be electrically connected to the source/drain pattern SD through the metal silicide layer MSL. The metal silicide layer MSL may be formed of or include at least one of metal silicides (e.g., titanium silicide, tantalum silicide, tungsten silicide, nickel silicide, and cobalt silicide).

The source/drain pattern SD and the metal silicide layer MSL on the source/drain pattern SD will be described in more detail with reference to FIGS. 2B and 3. The side surface of the source/drain pattern SD may include a first surface FA1 and a second surface FA2. A distance between the first surface FA1 and a center of the source/drain pattern SD may decrease in a direction away from the substrate 100 (e.g., in a third direction D3). A distance between the second surface FA2 and the center of the source/drain pattern SD may increase in the direction away from the substrate 100 or in the third direction D3.

A vertex SE of the source/drain pattern SD may be defined by the first surface FA1 and the second surface FA2. The vertex SE may protrude laterally in a direction away from the center of the source/drain pattern SD. For example, the vertex SE may protrude in the first direction D1.

The metal silicide layer MSL may be provided to cover the source/drain pattern SD. The metal silicide layer MSL may include an upper portion UP covering the first surface FA1 of the source/drain pattern SD and a lower portion LP covering the second surface FA2 of the source/drain pattern SD. Although not shown, in example embodiments, the lower portion LP of the metal silicide layer MSL may be omitted.

The upper portion UP of the metal silicide layer MSL may include a first portion PA1 and a second portion PA2. The first portion PA1 may be a region of the upper portion UP covered with the etch stop layer ESL. In other words, the first portion PA1 may be covered with an insulating material. The second portion PA2 may be another region of the upper portion UP covered with the contact AC. The first portion PA1 may be spaced apart from the contact AC. The first portion PA1 may not be vertically overlapped with the contact AC. The second portion PA2 may be spaced apart from the etch stop layer ESL. The second portion PA2 may be vertically overlapped with the contact AC.

A thickness of the first portion PA1 in a direction perpendicular to the first surface FA1 may be a first thickness T1. A thickness of the second portion PA2 in the direction perpendicular to the first surface FA1 may be a second thickness T2. The first thickness T1 and the second thickness T2 may be different from each other. As an example, the first thickness T1 may be smaller than the second thickness T2. Since the thicknesses of the first and second portions PA1 and PA2 are different from each other, the first surface FA1 may have a stepwise profile STP at an interface between the first and second portions PA1 and PA2.

The lower portion LP of the metal silicide layer MSL may have a third thickness T3, when measured in a direction perpendicular to the second surface FA2. The third thickness T3 may be equal to or different from the first thickness T1.

In the semiconductor device according to some example embodiments of the inventive concepts, the metal silicide layer MSL may include a portion (e.g., the second portion PA2 of the upper portion UP), which is interposed between the contact AC and the source/drain pattern SD, and portions (e.g., the first portion PA1 of the upper portion UP and the lower portion LP), which is not in contact with the contact AC. The metal silicide layer MSL may allow the contact AC and the source/drain pattern SD to be connected to each other with an increased contact area and/or a reduced resistance. This may make it possible to improve electric characteristics (e.g., an operation speed) of the semiconductor device.

Figure 4:
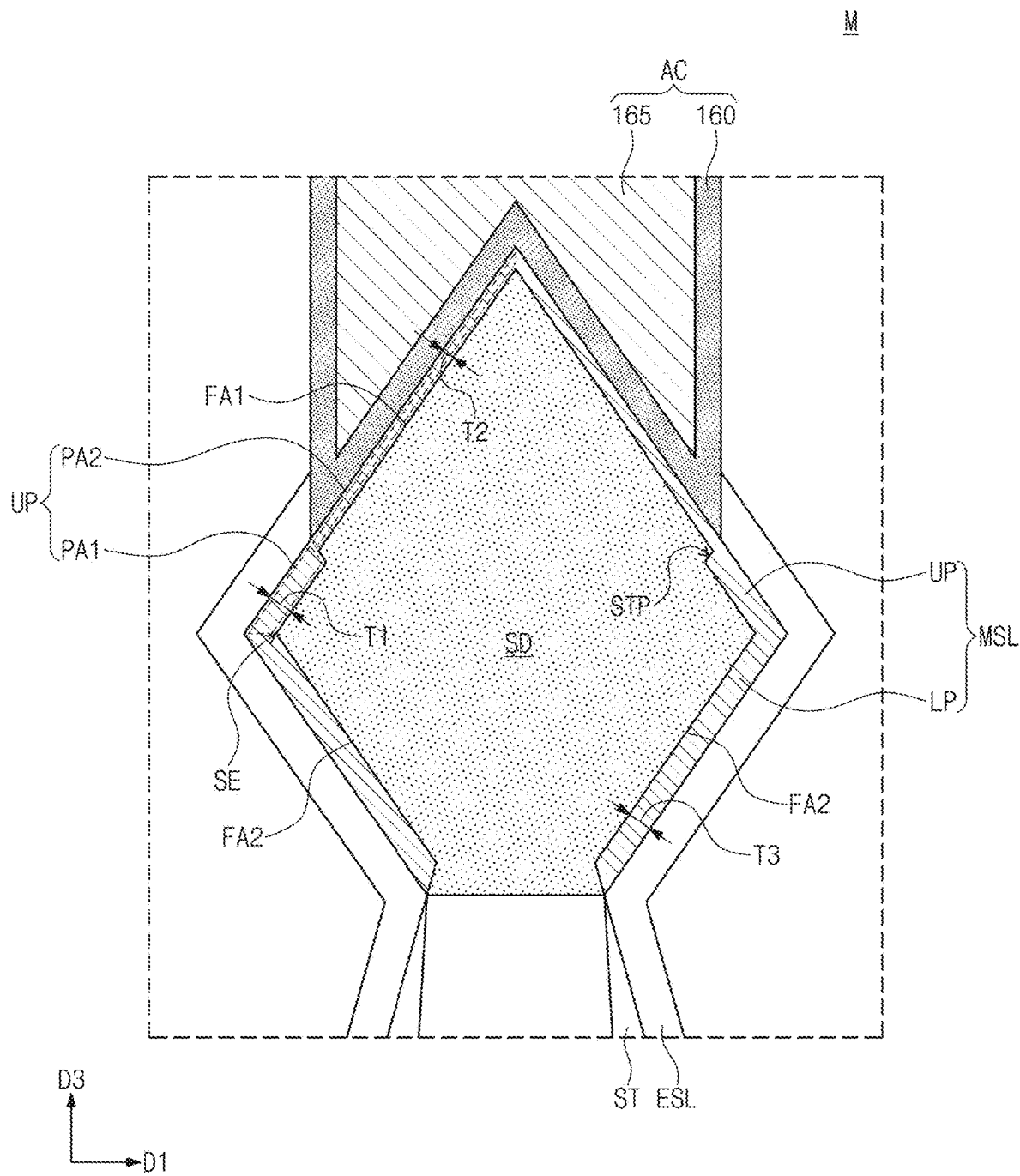
FIGS. 4 and 5 are enlarged sectional views, each of which illustrates a portion (e.g., corresponding a portion 'M' of FIG. 2B) of a semiconductor device according to some example embodiments of the inventive concepts.
Figure 5:
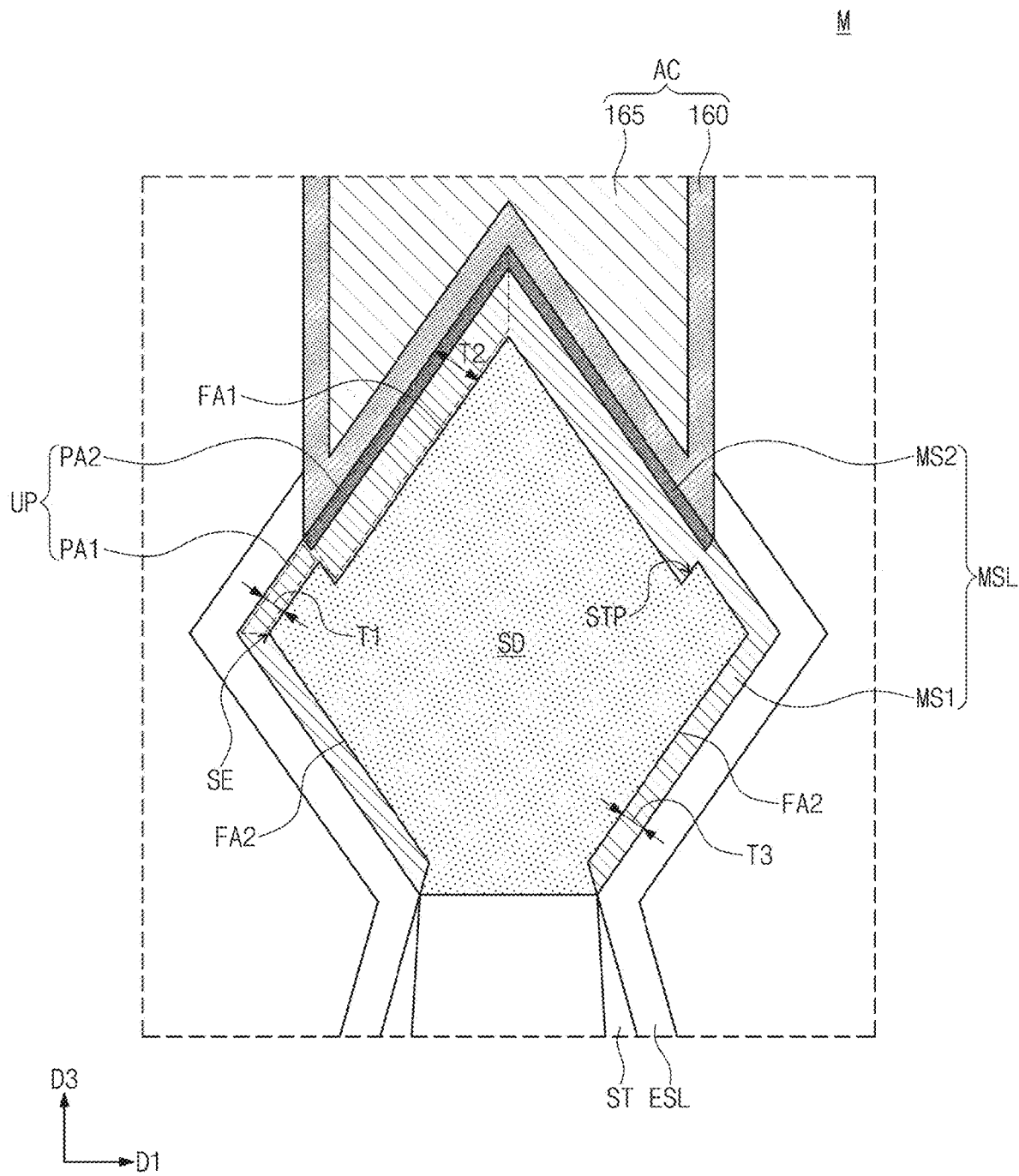

FIGS. 4 and 5 are enlarged sectional views, each of which illustrates a portion (e.g., corresponding a portion 'M' of FIG. 2B) of a semiconductor device according to some example embodiments of the inventive concepts. For concise description, an element previously described with reference to FIGS. 1, 2A to 2C, and 3 may be identified by the same reference number without repeating a description thereof.

Referring to FIGS. 1, 2A to 2C, and 4, a thickness of the first portion PA1 in a direction perpendicular to the first surface FA1 may be the first thickness T1. A thickness of the second portion PA2 in the direction perpendicular to the first surface FA1 may be the second thickness T2. The first thickness T1 and the second thickness T2 may be different from each other. As an example, the first thickness T1 may be larger than the second thickness T2. Since the thicknesses of the first and second portions PA1 and PA2 are different from each other, the first surface FA1 may have the stepwise profile STP at the interface between the first and second portions PA1 and PA2.

Referring to FIGS. 1, 2A to 2C, and 5, the metal silicide layer MSL may include a first silicide pattern MS1 and a second silicide pattern MS2. The second silicide pattern MS2 may be provided in the second portion PA2 of the upper portion UP of the metal silicide layer MSL. The second silicide pattern MS2 may be provided on the first silicide pattern MS1. The second silicide pattern MS2 may be in direct contact with the contact AC. The first silicide pattern MS1 may be interposed between the source/drain pattern SD and the contact AC.

The second silicide pattern MS2 may contain a metal element that is the same as or different from that of the first silicide pattern MS1. As an example, the first and second silicide patterns MS1 and MS2 may be formed of or include each independently at least one of titanium silicide, tantalum silicide, tungsten silicide, nickel silicide, or cobalt silicide.

Since the second portion PA2 of the metal silicide layer MSL includes the second silicide pattern MS2, the metal element in the second portion PA2 may be different from a metal element in the first portion PA1.

Figure 6A:
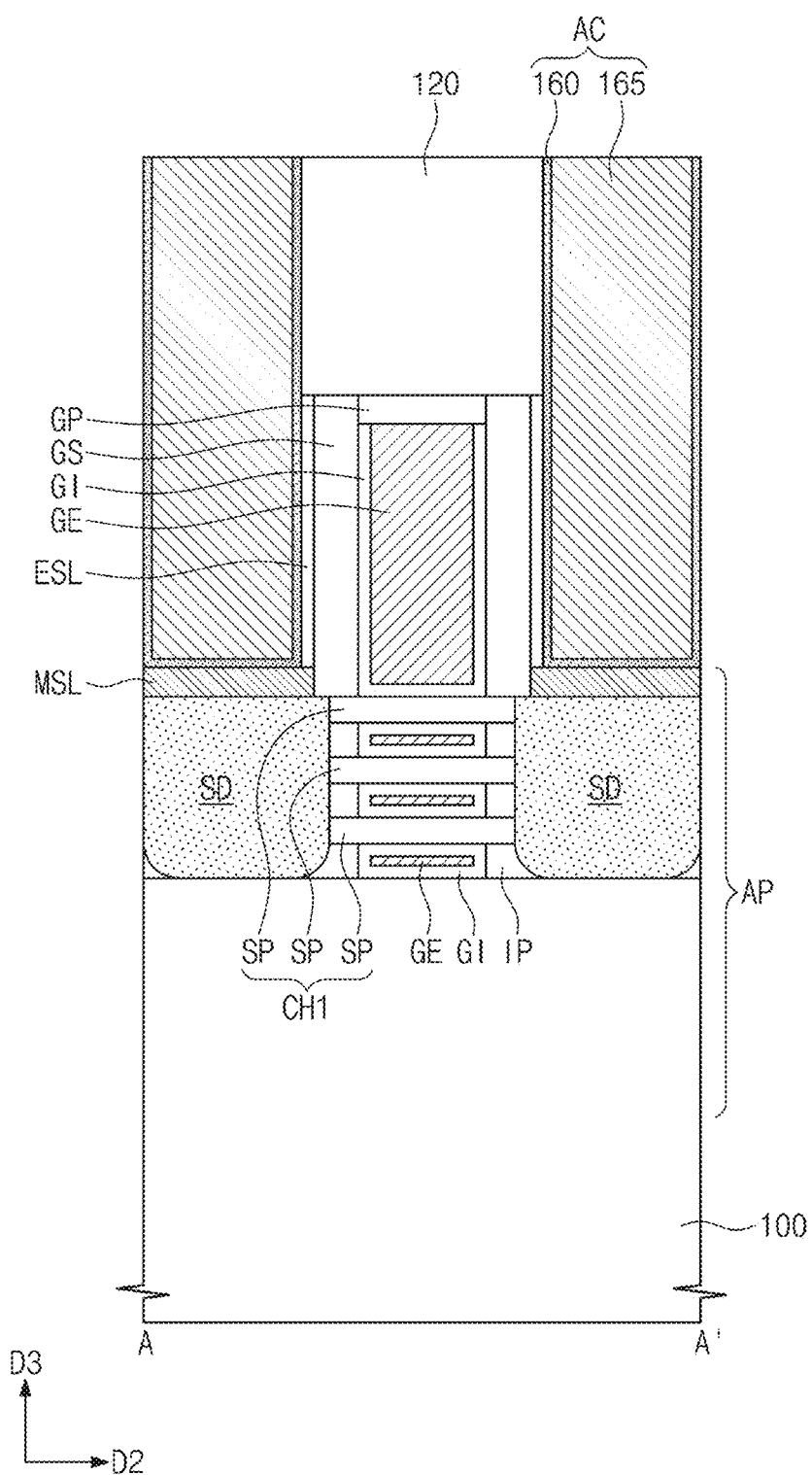
FIGS. 6A and 6B are sectional views, which are taken along lines A-A', B-B', and C-C', respectively, of FIG. 1 to illustrate a semiconductor device according to some example embodiments of the inventive concepts.
Figure 6B:
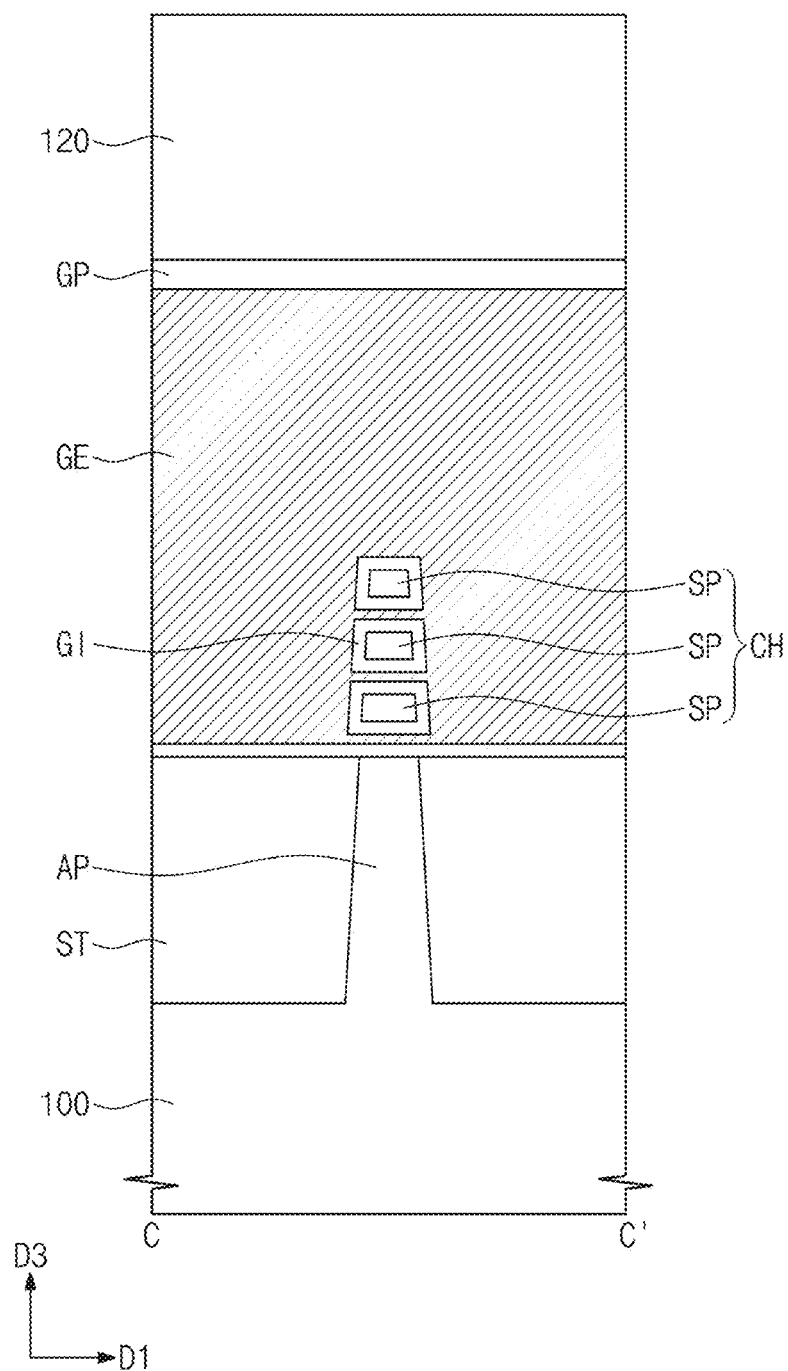

FIGS. 6A and 6B are sectional views, which are taken along lines A-A', B-B', and C-C', respectively, of FIG. 1 to illustrate a semiconductor device according to some example embodiments of the inventive concepts. For concise description, an element previously described with reference to FIGS. 1, 2A to 2C, and 3 may be identified by the same reference number without repeating a description thereof.

Referring to FIGS. 1, 2B, 6A, and 6B, the channel region CH of the active pattern AP may include a plurality of vertically-stacked semiconductor patterns SP. The semiconductor patterns SP may be spaced apart from each other in the third direction D3 perpendicular to the top surface of the substrate 100. The semiconductor patterns SP may be overlapped with each other, when viewed in a plan view. The source/drain pattern SD may be in direct contact with side surfaces of the semiconductor patterns SP. In other words, the semiconductor patterns SP may be provided to connect an adjacent pair of the source/drain patterns SD to each other. Although three semiconductor patterns SP are illustrated, the inventive concept is not limited to the specific number of the semiconductor patterns SP. In some example embodiments, the semiconductor patterns SP may have the same thickness, but in example embodiments, the semiconductor patterns SP may be provided to have at least two different thicknesses.

The semiconductor patterns SP may include substantially the same semiconductor material. As an example, the semiconductor patterns SP may be formed of or include at least one of silicon, germanium, or silicon germanium.

The gate electrode GE on the active pattern AP may be provided to surround at least one of the semiconductor patterns SP (e.g., see FIG. 6B). For example, the gate electrode GE on the active pattern AP may be provided to face top, bottom, and opposite side surfaces of at least one of the semiconductor patterns SP. That is, the transistor according to some example embodiments may be a gate-all-around field effect transistor. The gate dielectric patterns GI may be interposed between the gate electrode GE and the semiconductor patterns SP.

Insulating patterns IP may be interposed between the source/drain pattern SD and the gate electrode GE. The insulating patterns IP may be interposed between the semiconductor patterns SP, which are vertically spaced apart from each other. The insulating patterns IP may be used to electrically disconnect the gate electrode GE from the source/drain patterns SD. As an example, the insulating patterns IP may be formed of or include silicon nitride.

The source/drain patterns SD according to some example embodiments may be provided to have substantially the same shapes and features as those described with reference to FIGS. 1, 2A to 2C, and 3.

Figure 7:
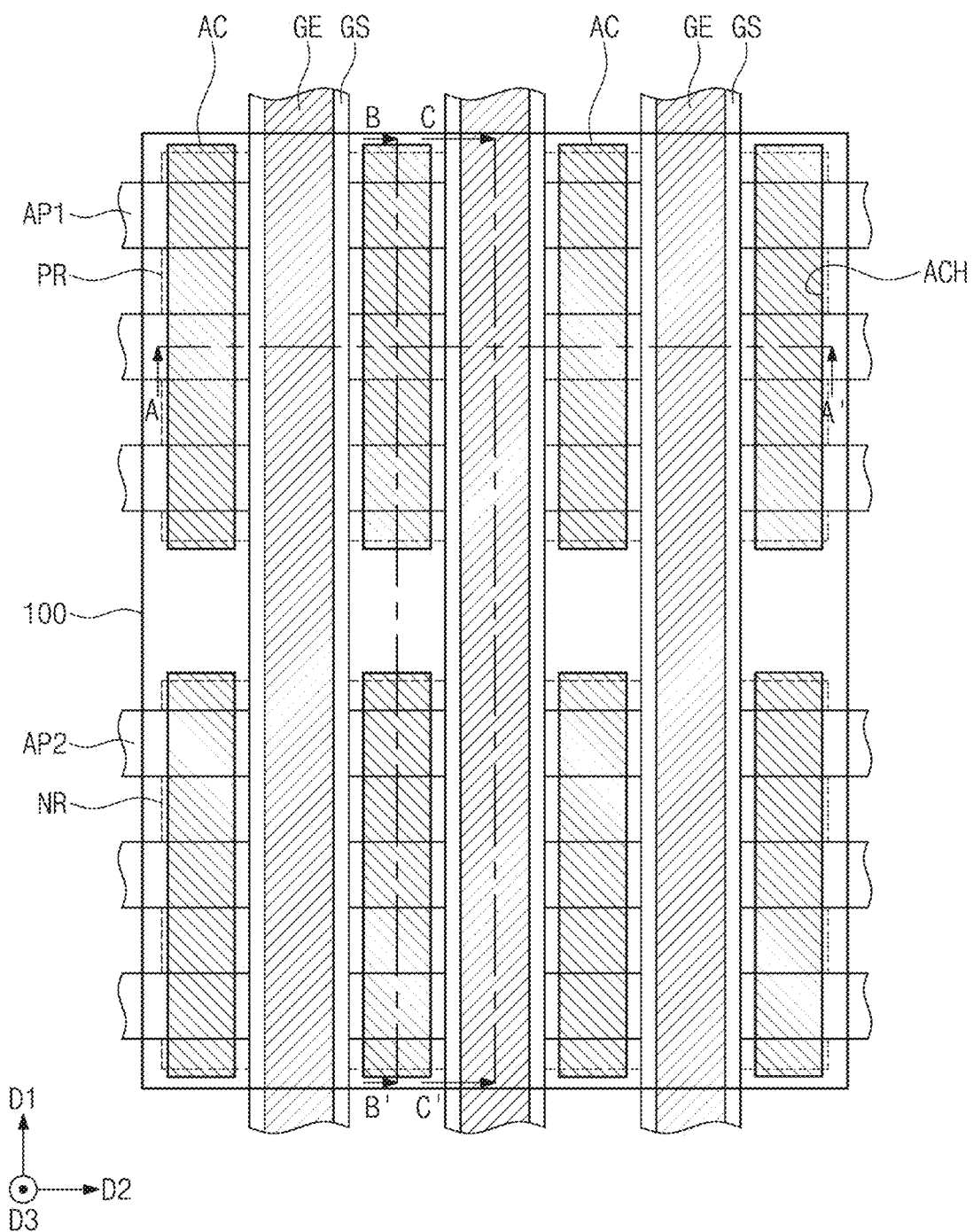
FIG. 7 is a plan view illustrating a semiconductor device according to some example embodiments of the inventive concepts.
Figure 8A:
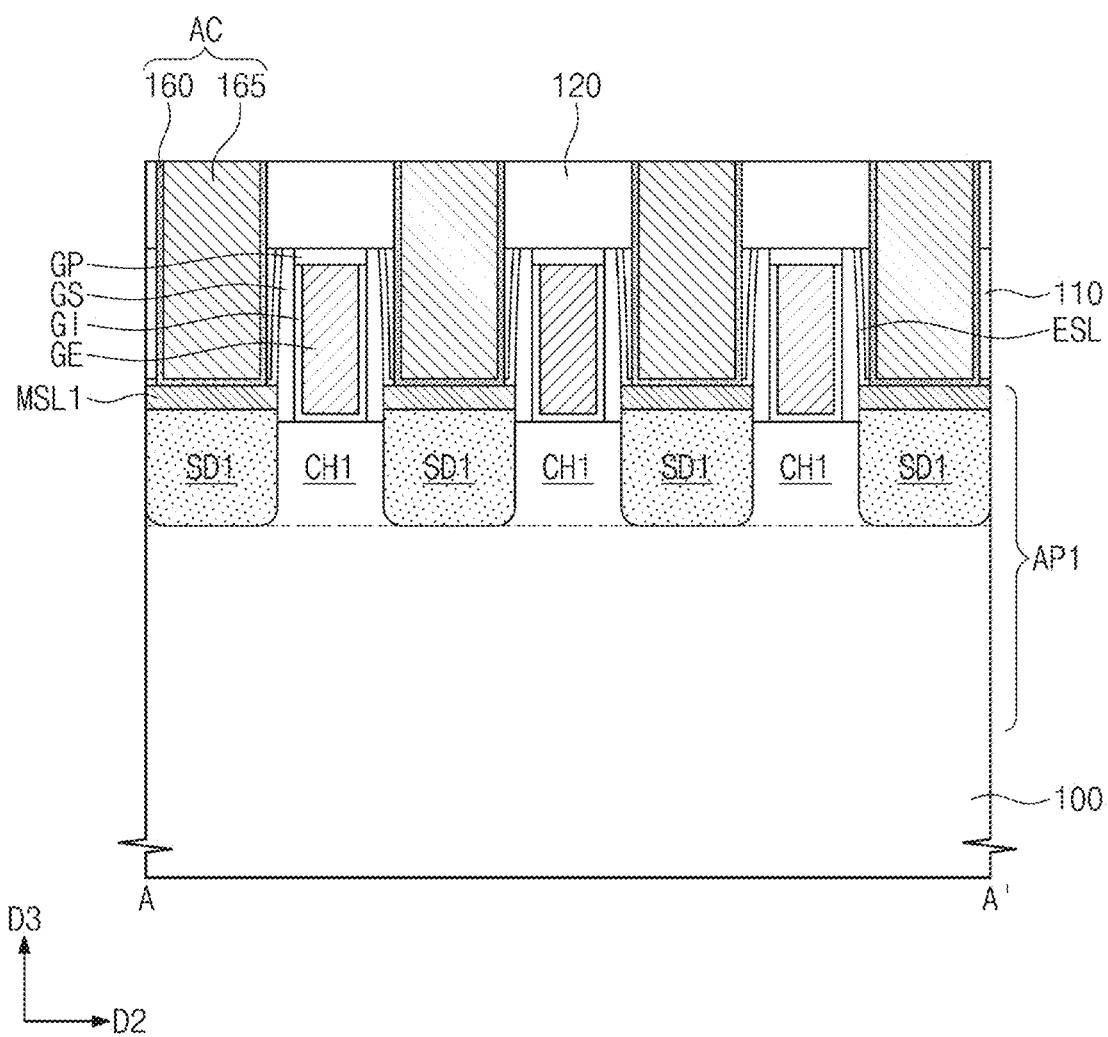
FIGS. 8A to 8C are sectional views taken along lines A-A', B-B', and C-C', respectively, of FIG. 7.
Figure 8B:
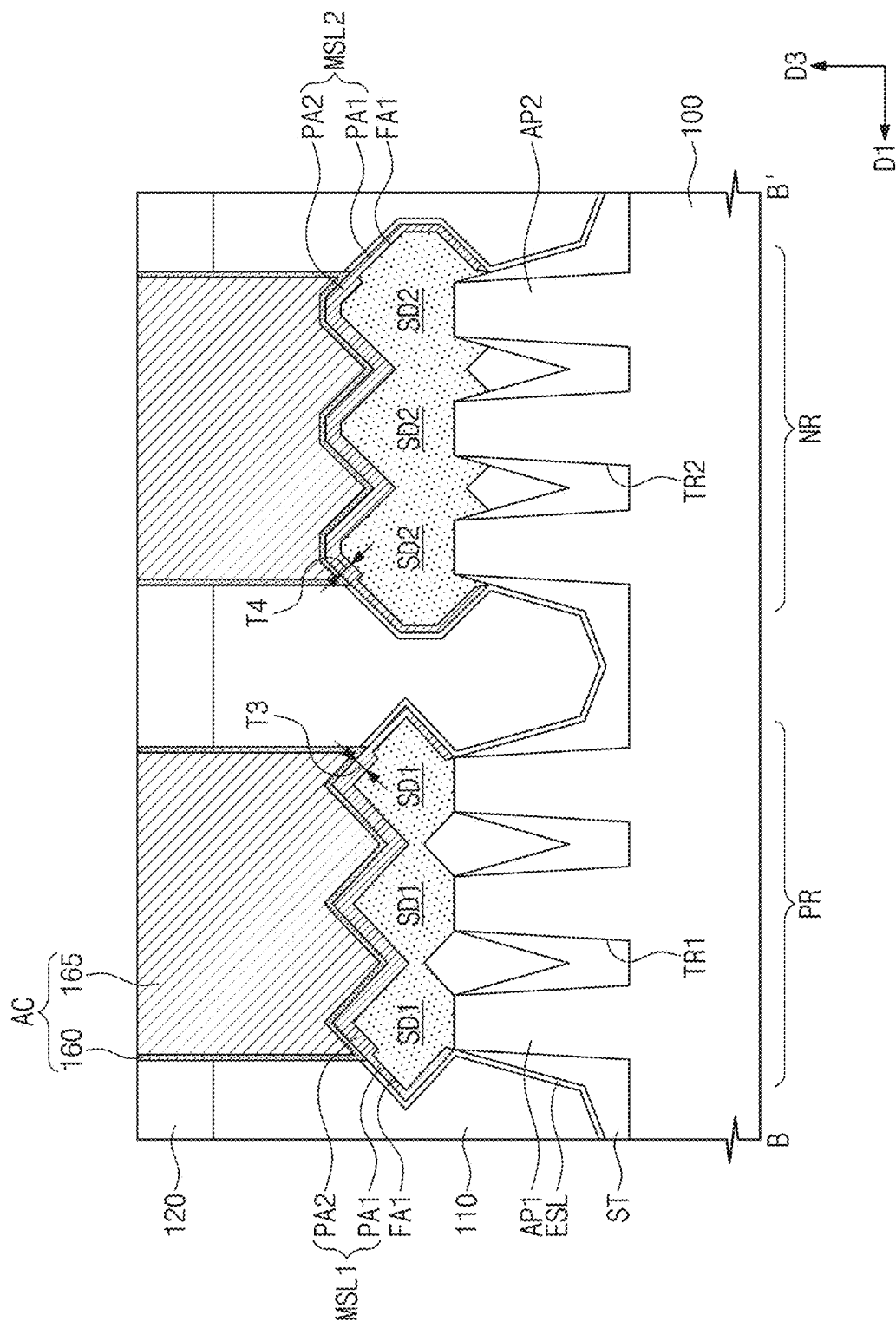
Figure 8C:
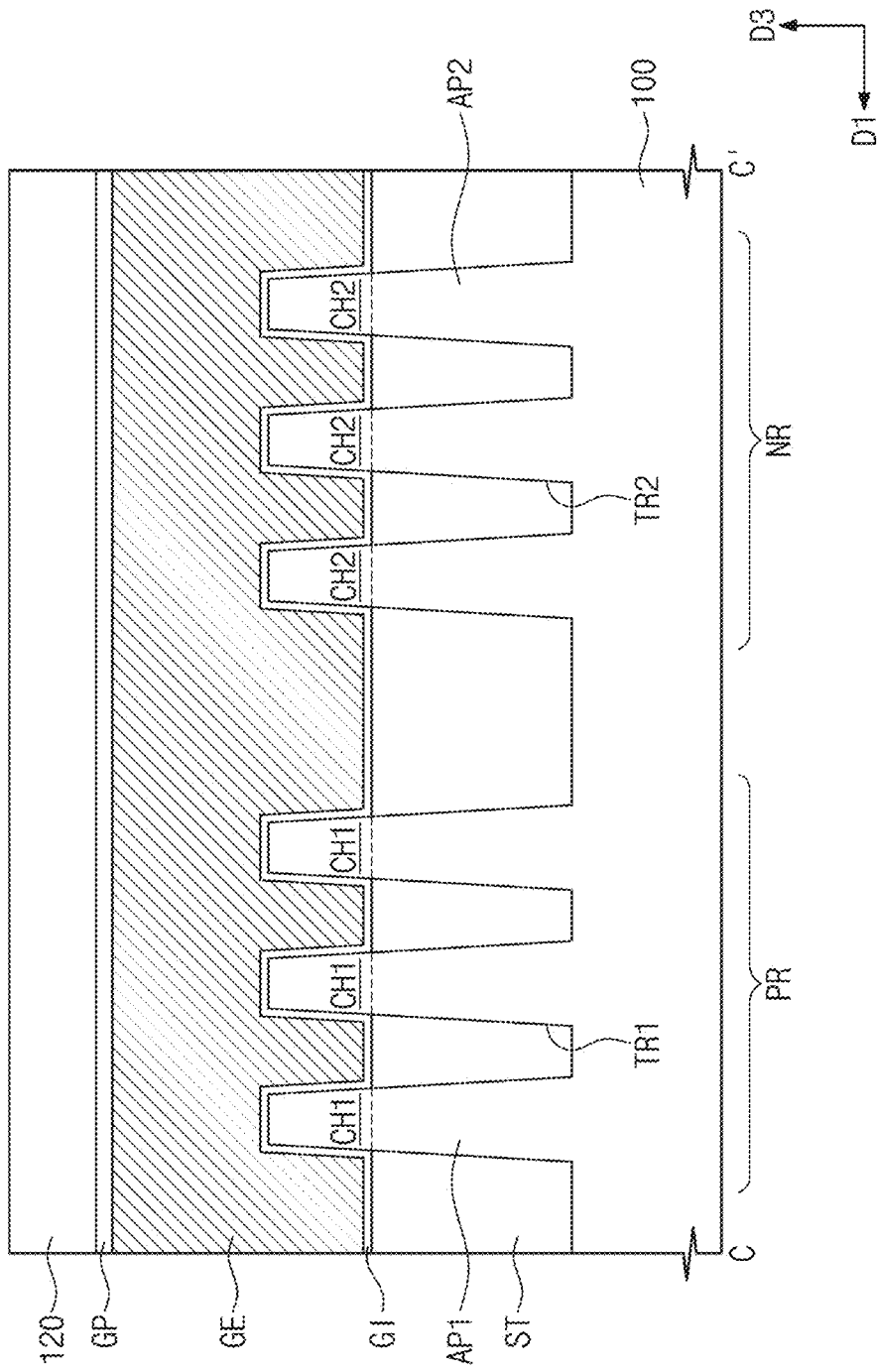

FIG. 7 is a plan view illustrating a semiconductor device according to some example embodiments of the inventive concepts. FIGS. 8A to 8C are sectional views taken along lines A-A', B-B', and C-C', respectively, of FIG. 7. For concise description, an element previously described with reference to FIGS. 1, 2A to 2C, and 3 may be identified by the same reference number without repeating a description thereof.

Referring to FIGS. 7 and 8A to 8C, the device isolation layers ST may be provided in an upper portion of the substrate 100. The device isolation layers ST may include a PMOSFET region PR and an NMOSFET region NR. The PMOSFET region PR and the NMOSFET region NR may be spaced apart from each other in the first direction D1 parallel to the top surface of the substrate 100, and the device isolation layer ST may be interposed between the PMOSFET and NMOSFET regions PR and NR. The PMOSFET region PR and the NMOSFET region NR may extend in the second direction D2 crossing the first direction D1. Although not shown, a bottom level of the device isolation layer ST between the PMOSFET and NMOSFET regions PR and NR may be deeper than that of the device isolation layers ST between active patterns AP1 and AP2. As an example, the PMOSFET region PR and the NMOSFET region NR may be a logic cell region, on which logic transistors constituting the logic circuit of the semiconductor device are integrated.

A plurality of active patterns AP1 and AP2 extending in the second direction D2 may be provided on the PMOSFET and NMOSFET regions PR and NR. The active patterns AP1 and AP2 may include first active patterns AP1 on the PMOSFET region PR and second active patterns AP2 on the NMOSFET region NR. The first and second active patterns AP1 and AP2 may be portions of the substrate 100 and may have a protruding shape. The first and second active patterns AP1 and AP2 may be arranged in the first direction D1.

A first trench TR1 may be defined between adjacent ones of the first active patterns AP1, and a second trench TR2 may be defined between adjacent ones of the second active patterns AP2. The device isolation layers ST may be provided to fill the first and second trenches TR1 and TR2. As shown in the drawings, three first active patterns AP1 may be provided on the PMOSFET region PR and three second active patterns AP2 may be provided on the NMOSFET region NR, but the inventive concept is not limited thereto.

First channel regions CH1 and first source/drain patterns SD1 may be provided in upper portions of the first active patterns AP1. The first source/drain patterns SD1 may be p-type impurity regions. Each of the first channel regions CH1 may be interposed between a pair of the first source/drain patterns SD1. Second channel regions CH2 and second source/drain patterns SD2 may be provided in upper portions of the second active patterns AP2. The second source/drain patterns SD2 may be n-type impurity regions. Each of the second channel regions CH2 may be interposed between a pair of the second source/drain patterns SD2.

The first and second source/drain patterns SD1 and SD2 may be epitaxial patterns, which are formed using a selective epitaxial growth process. As an example, the first source/drain patterns SD1 may be formed of or include a semiconductor material whose lattice constant is greater than that of the substrate 100. As an example, the second source/drain patterns SD2 may include a semiconductor material having a lattice constant equal to or less than that of the substrate 100. The first and second source/drain patterns SD1 and SD2 may be provided to contain semiconductor materials different from each other. The first and second source/drain patterns SD1 and SD2 may have sectional shapes that are different from each other (e.g., see FIG. 8B).

The gate electrodes GE may be provided to cross the first and second active patterns AP1 and AP2 and to extend in the first direction D1. The gate electrodes GE may be spaced apart from each other in the second direction D2. Each of the gate electrodes GE may be overlapped with the first and second channel regions CH1 and CH2, when viewed in a plan view. A pair of the gate spacers GS may be respectively provided on opposite side surfaces of each of the gate electrodes GE. The gate dielectric patterns GI may be interposed between the gate electrodes GE and the first and second active patterns AP1 and AP2. The gate capping pattern GP may be provided on each of the gate electrodes GE.

In addition, at least one contact AC may be provided between a pair of the gate electrodes GE to penetrate the first and second interlayered insulating layers 110 and 120 and to electrically connected to the first and second source/drain patterns SD1 and SD2.

Referring back to FIG. 8B, three first source/drain patterns SD1, which are placed adjacent to each other in the first direction D1, may be merged to constitute a single first source/drain pattern SD1. Three second source/drain patterns SD2, which are placed adjacent to each other in the first direction D1, may be merged to constitute a single second source/drain pattern SD2.

A first metal silicide layer MSL1 may be provided to cover the first source/drain pattern SD1. A second metal silicide layer MSL2 may be provided to cover the second source/drain pattern SD2. Each of the first and second metal silicide layers MSL1 and MSL2 may include the first portion PA1 covered with the etch stop layer ESL and the second portion PA2 covered with the contact AC. A thickness of the first portion PA1 on the first surface FA1 of the first source/drain pattern SD1 may be different from a thickness of the second portion PA2 on the first surface FA1. A thickness of the first portion PA1 on the first surface FA1 of the second source/drain pattern SD2 may be different from a thickness of the second portion PA2 on the first surface FA1.

The thickness of the first metal silicide layer MSL1 may be equal to or different from that of the second metal silicide layer MSL2. For example, the thickness of the second portion PA2 of the first metal silicide layer MSL1 may be the third thickness T3, and the thickness of the second portion PA2 of the second metal silicide layer MSL2 may be a fourth thickness T4, which is equal to or different from the third thickness T3.

The second metal silicide layer MSL2 may contain a metal element, which is the same as or different from that of the first metal silicide layer MSL1. As an example, the first metal silicide layer MSL1 and the second metal silicide layer MSL2 may be formed of or include each independently at least one of titanium silicide, tantalum silicide, tungsten silicide, nickel silicide, or cobalt silicide.

In some example embodiments, each of the first and second metal silicide layers MSL1 and MSL2 may further include the first portion PA1, which is extended from the second portion PA2 to cover the source/drain pattern SD1 or SD2. Thus, each of the first and second metal silicide layers MSL1 and MSL2 may allow the contact AC and the source/drain pattern SD1 or SD2 to be connected to each other with an increased contact area and/or a reduced resistance. This may make it possible to improve electric characteristics (e.g., an operation speed) of the semiconductor device.

FIGS. 9, 11, 13, 15, 17, and 19 are plan views illustrating a method of fabricating a semiconductor device according to some example embodiments of the inventive concepts. FIGS. 10A, 12A, 14A, 16A, 18A, and 20A are sectional views taken along lines A-A' of FIGS. 9, 11, 13, 15, 17, and 19, respectively. FIGS. 10B, 12B, 14B, 16B, 18B, and 20B are sectional views taken along lines B-B' of FIGS. 9, 11, 13, 15, 17, and 19, respectively. FIGS. 12C, 14C, 16C, 18C, and 20C are sectional views taken along lines C-C' of FIGS. 11, 13, 15, 17, and 19, respectively.

Figure 9:
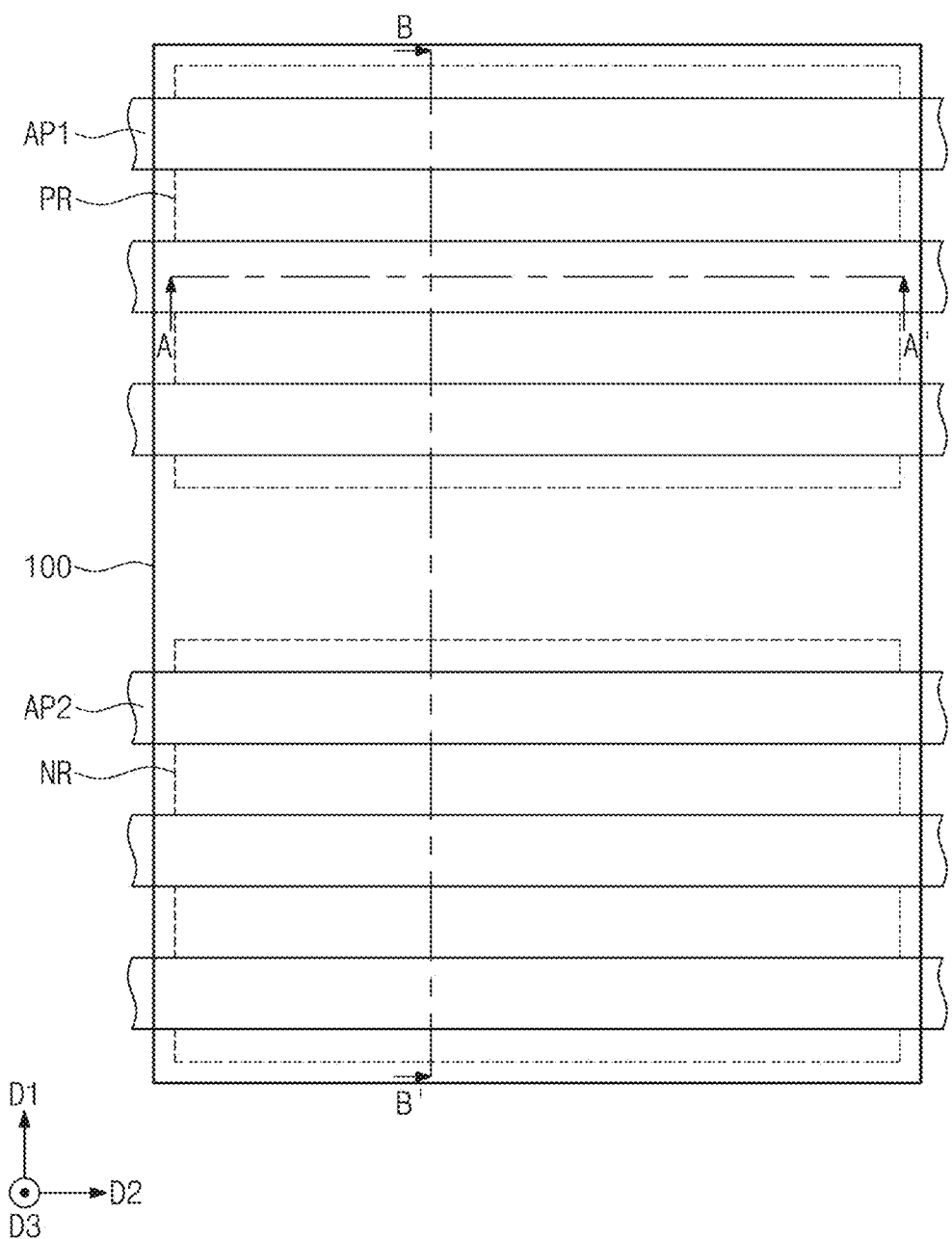
FIGS. 9, 11, 13, 15, 17, and 19 are plan views illustrating a method of fabricating a semiconductor device according to some example embodiments of the inventive concepts.
Figure 10A:
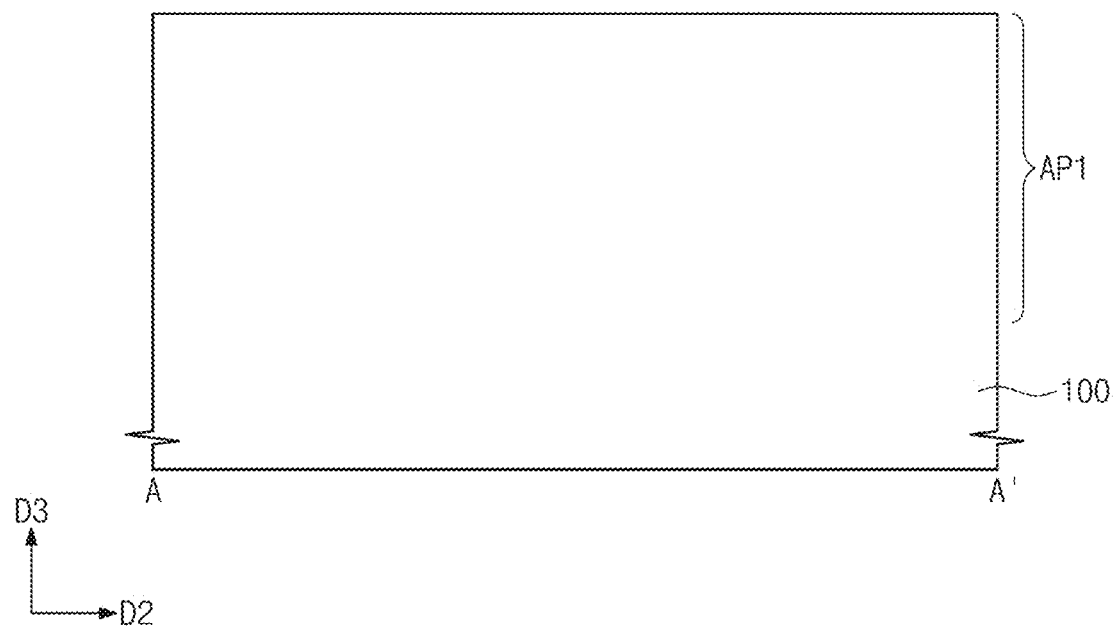
FIGS. 10A, 12A, 14A, 16A, 18A, and 20A are sectional views taken along lines A-A' of FIGS. 9, 11, 13, 15, 17, and 19, respectively.
Figure 10B:
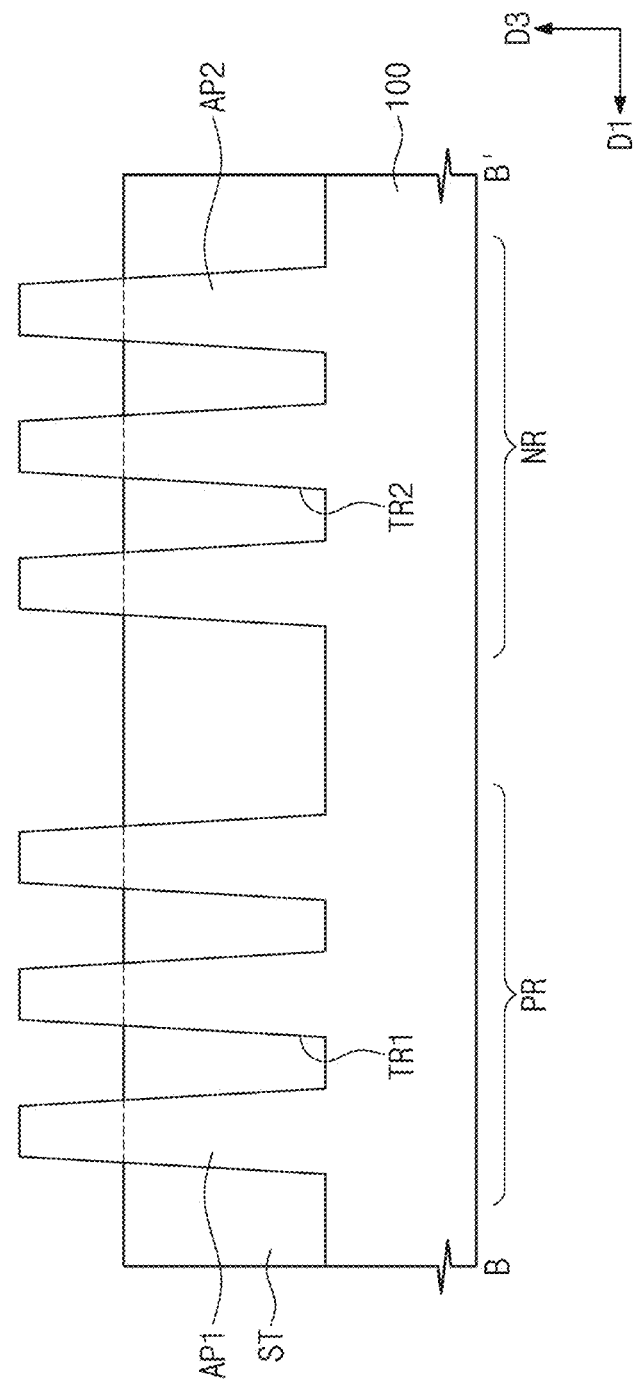
FIGS. 10B, 12B, 14B, 16B, 18B, and 20B are sectional views taken along lines B-B' of FIGS. 9, 11, 13, 15, 17, and 19, respectively.
Figure 11:
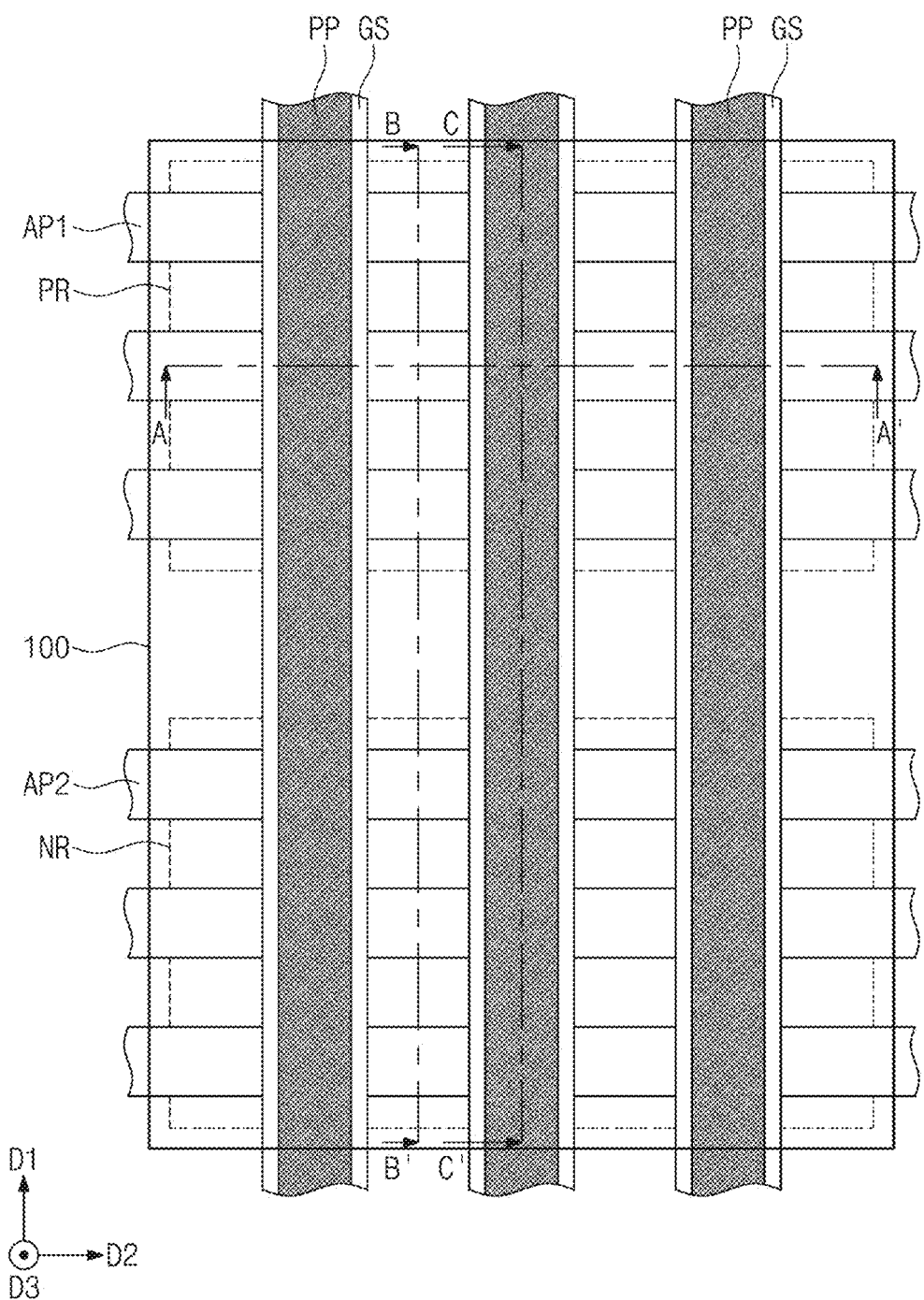
Figure 12A:
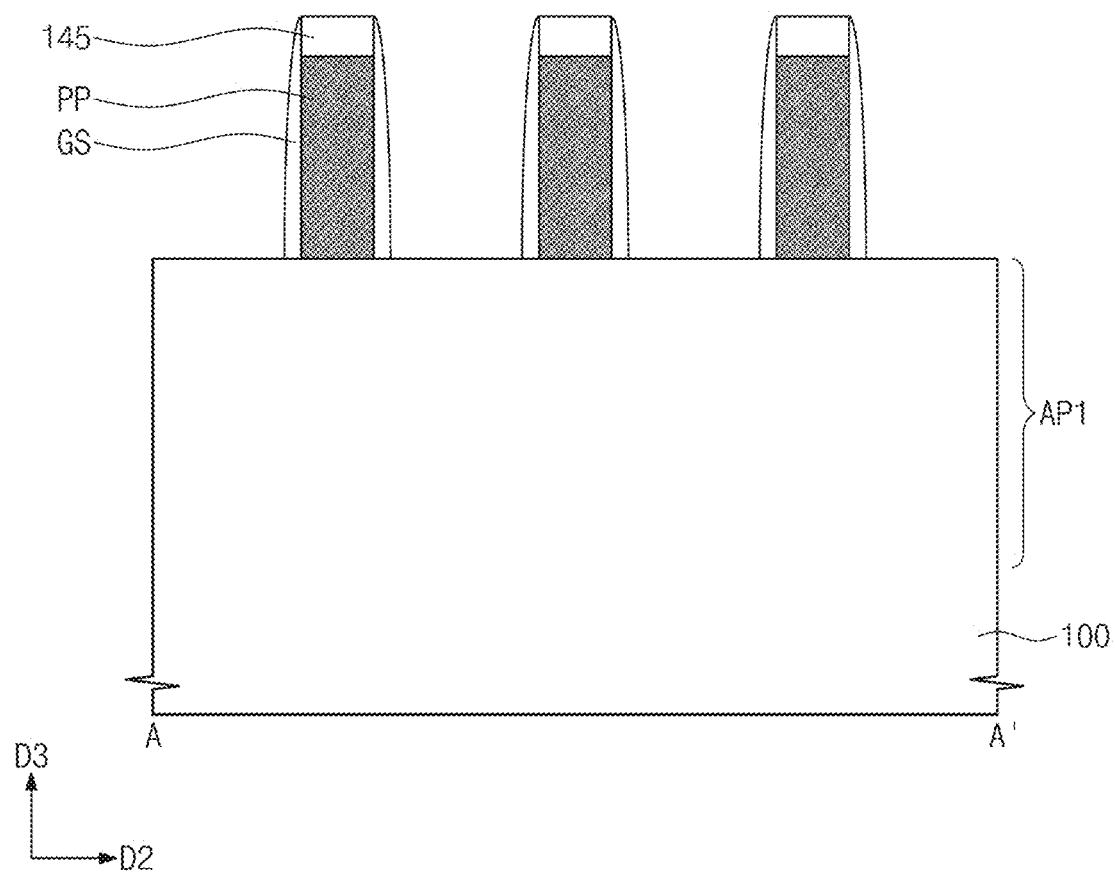
Figure 12B:
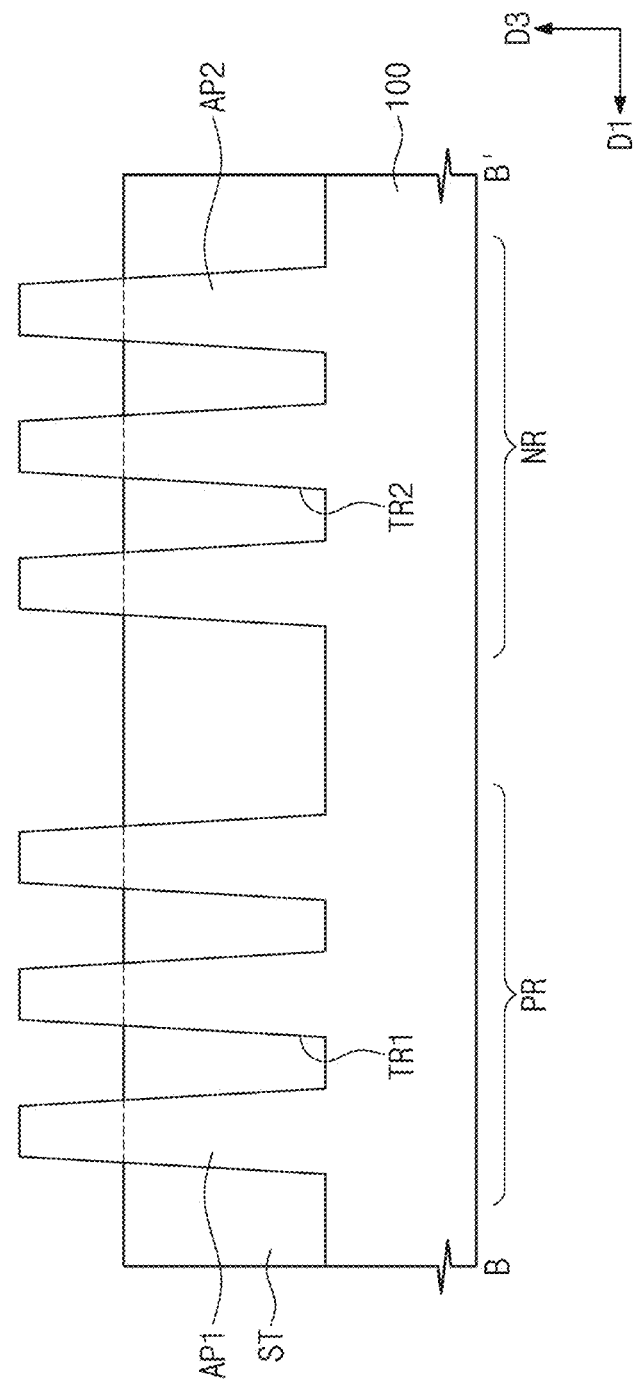
Figure 12C:
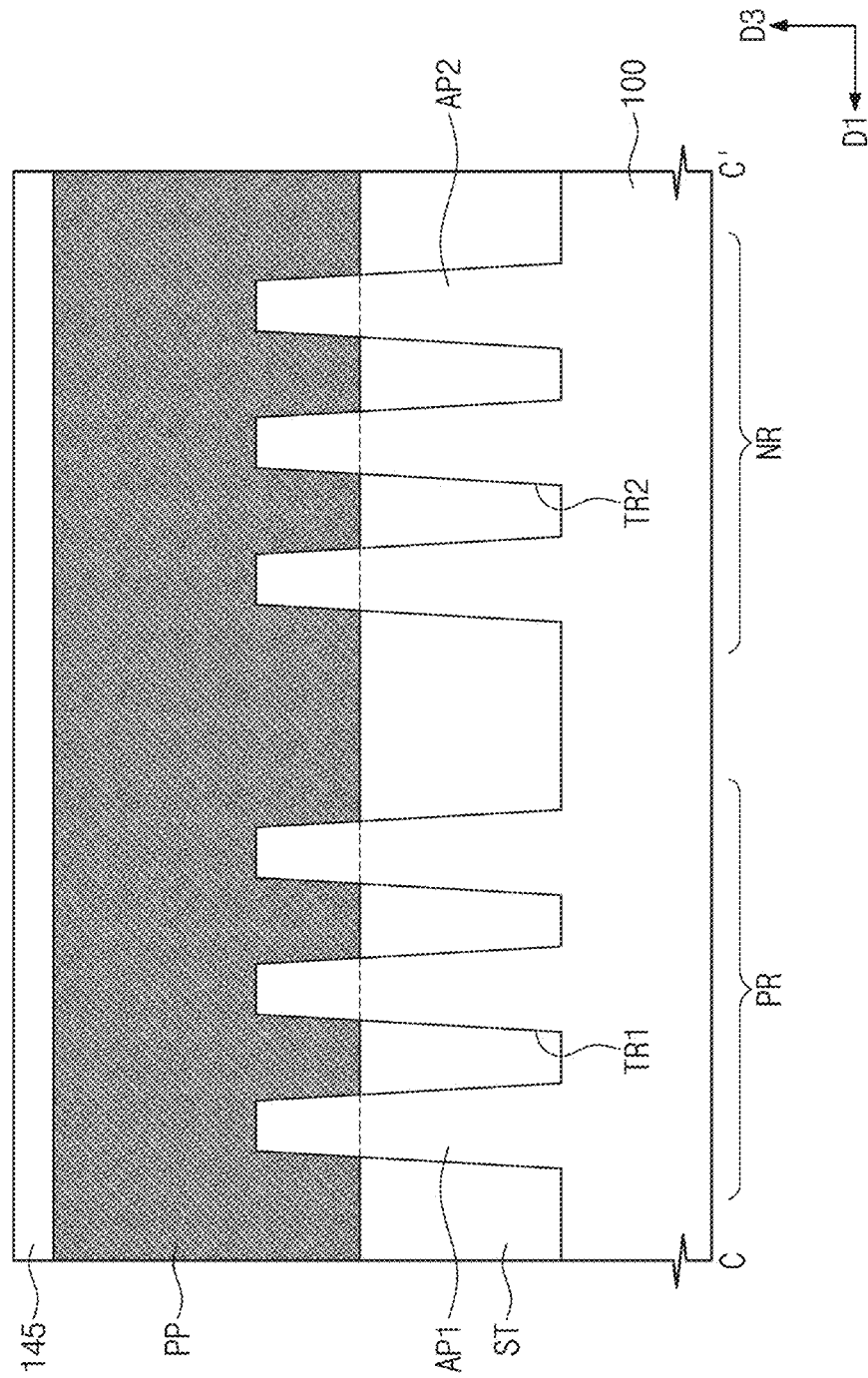
FIGS. 12C, 14C, 16C, 18C, and 20C are sectional views taken along lines C-C' of FIGS. 11, 13, 15, 17, and 19, respectively.
Figure 13:
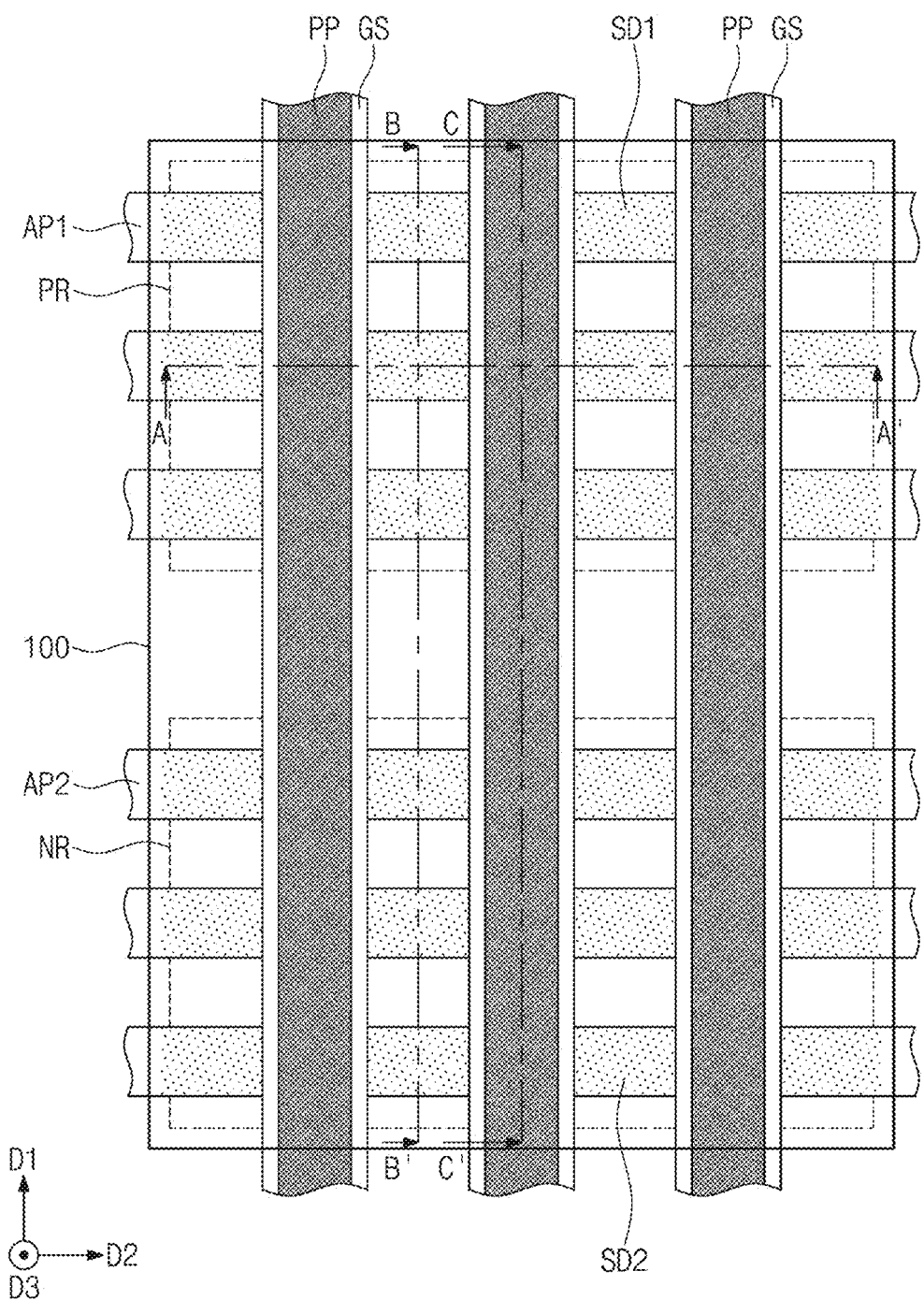
Figure 14A:
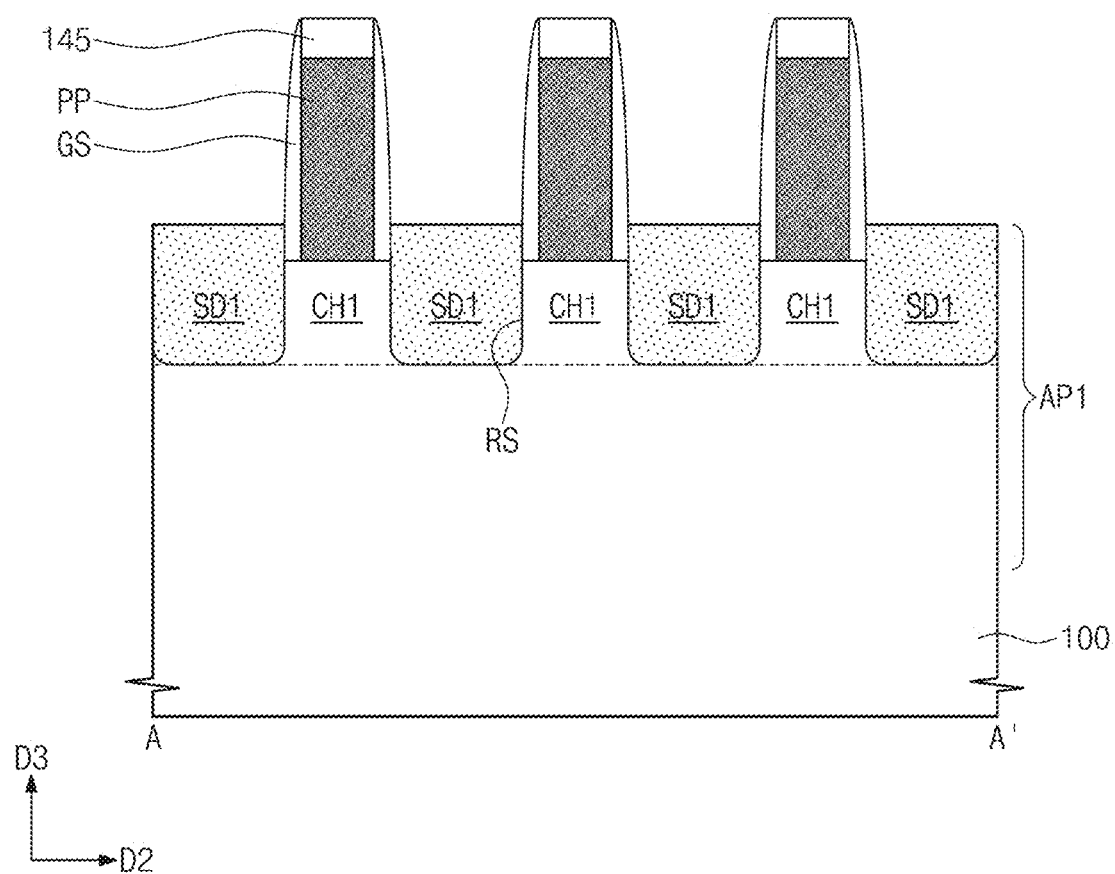
Figure 14B:
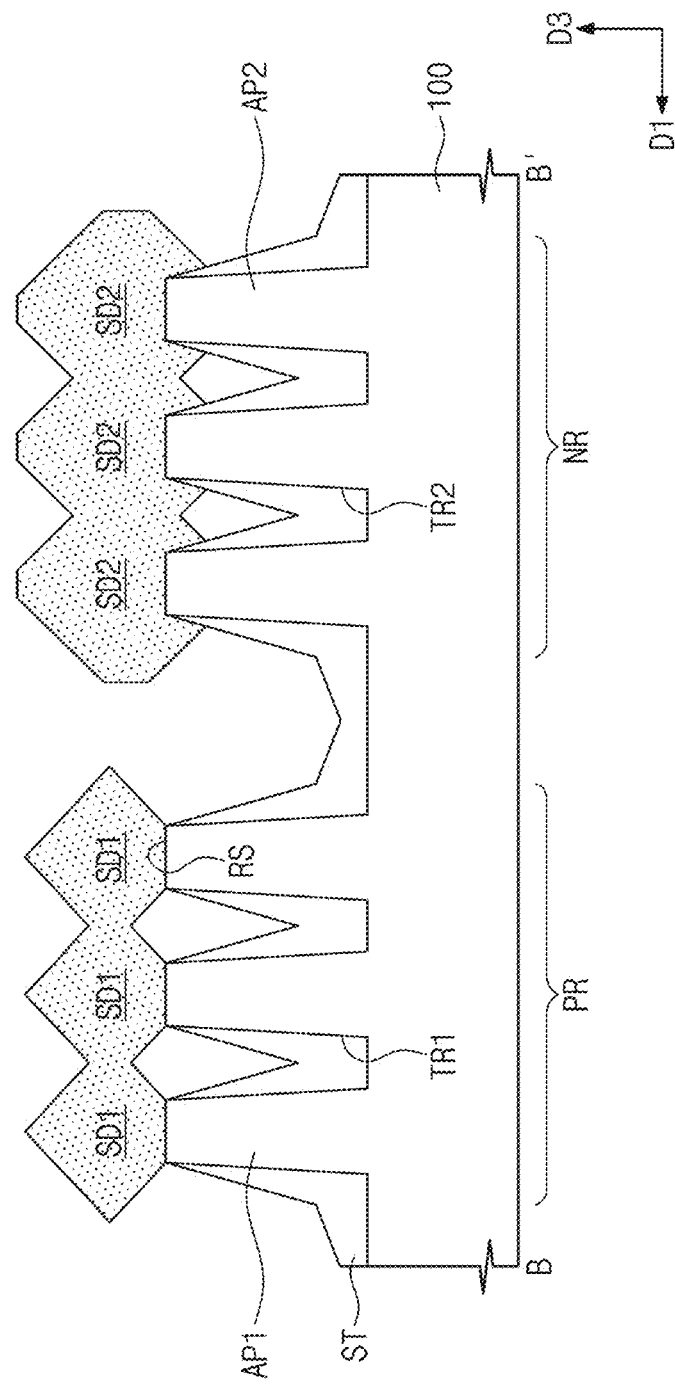
Figure 14C:
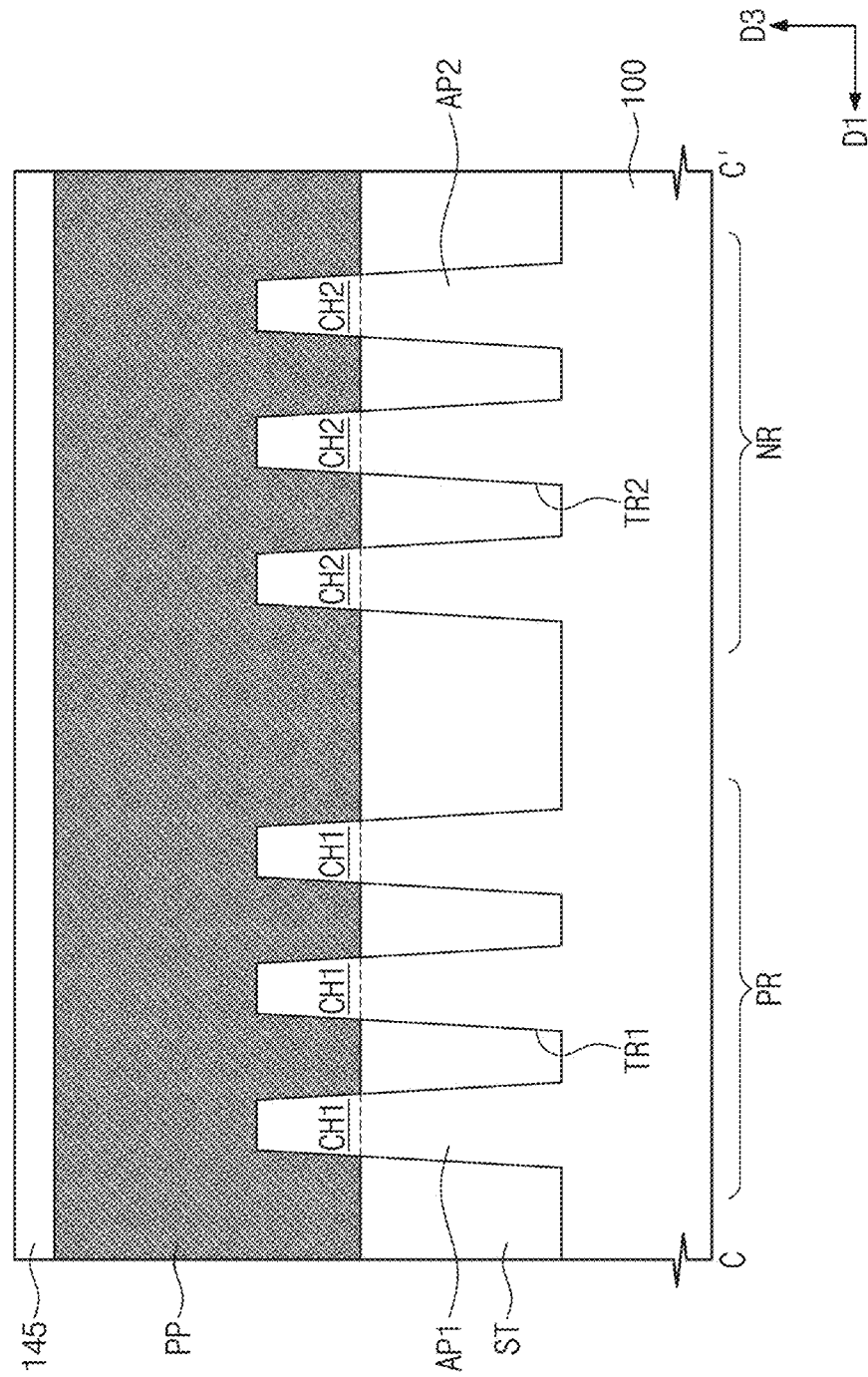
Figure 15:
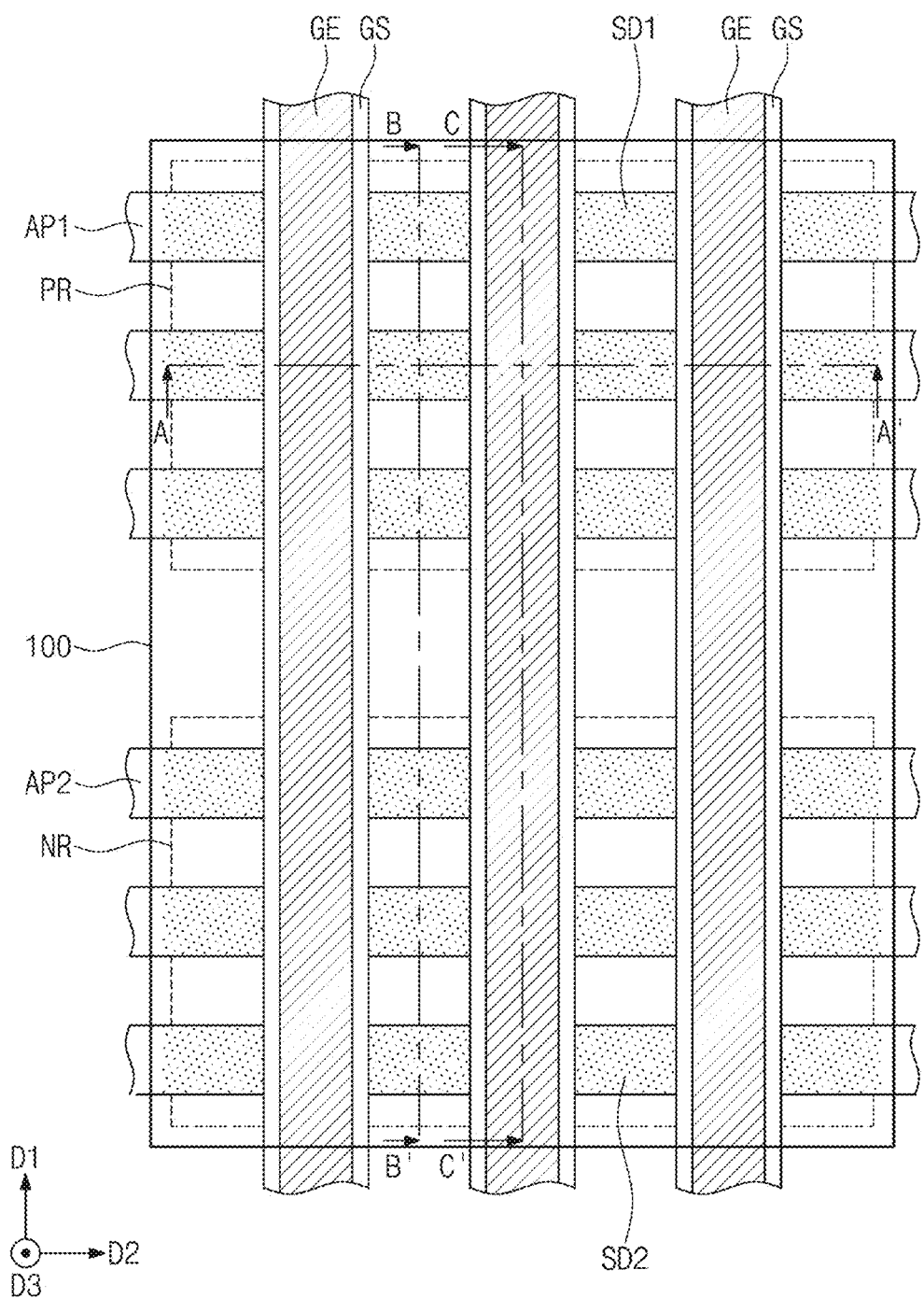
Figure 16A:
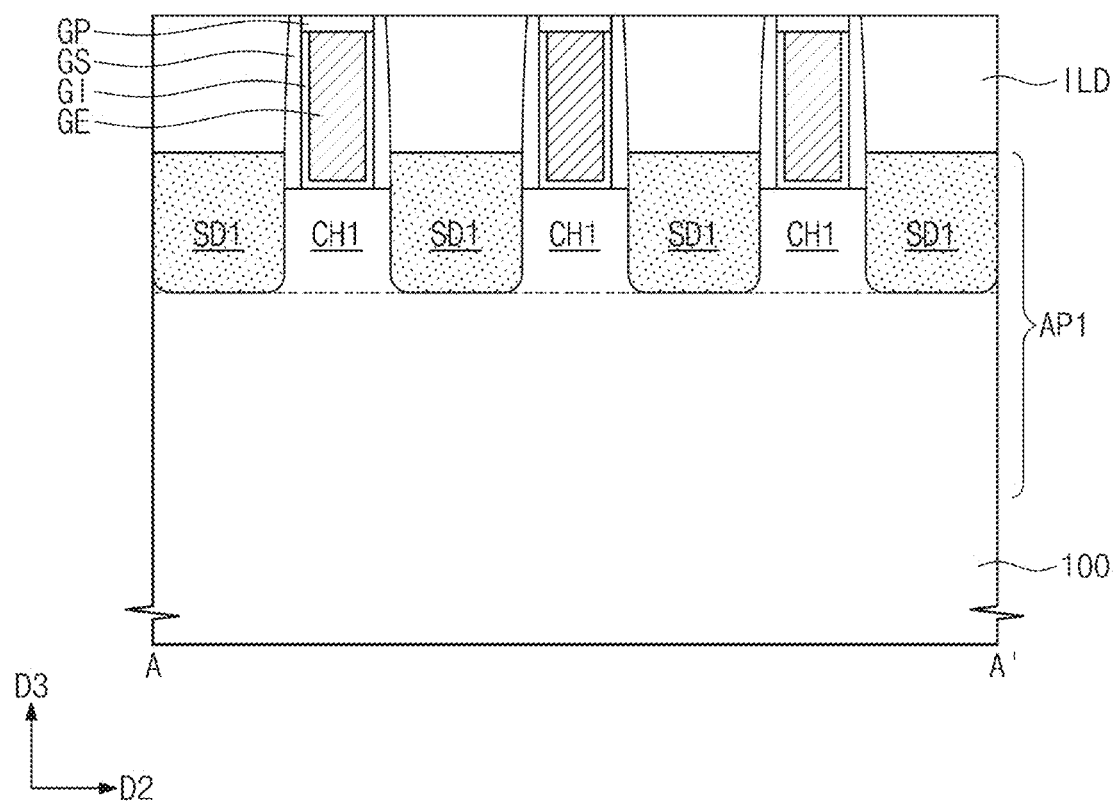
Figure 16B:
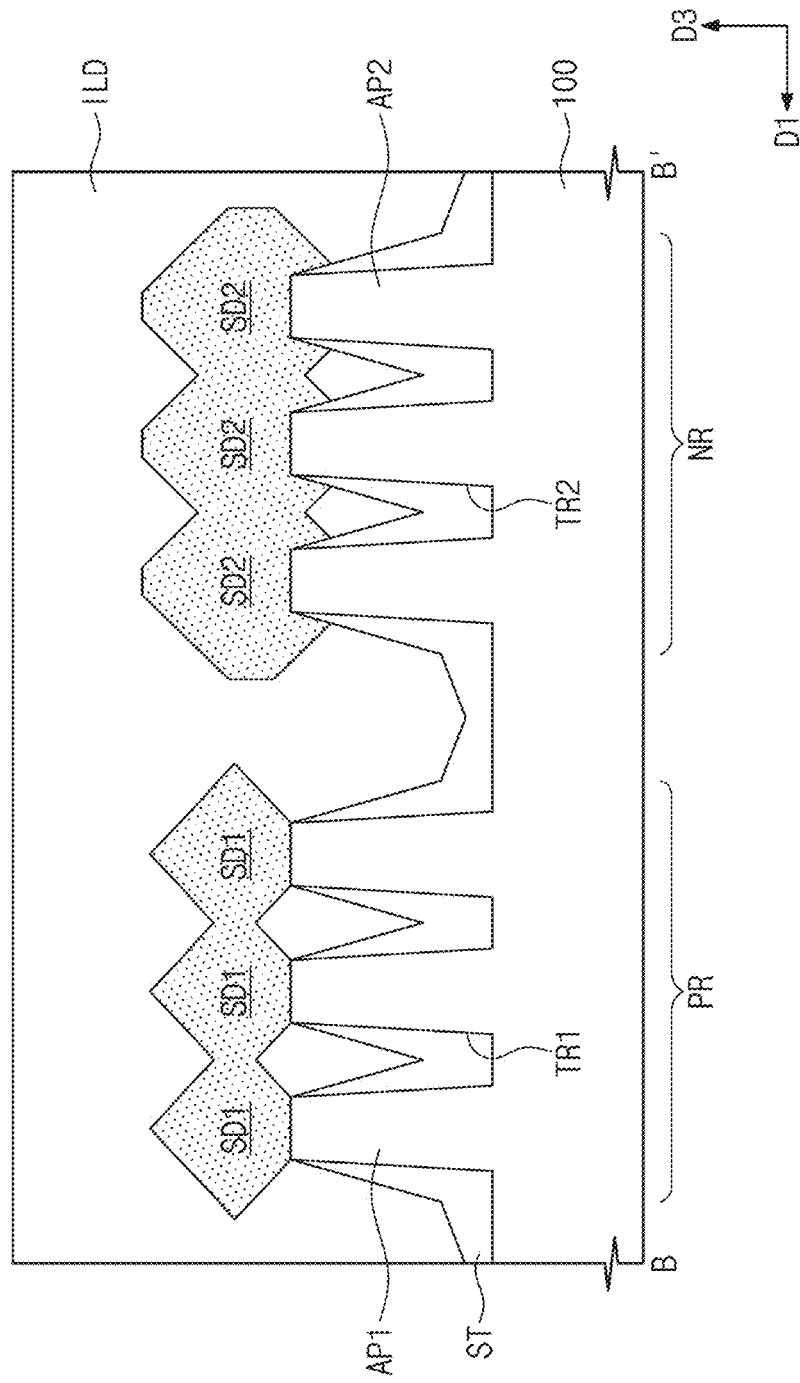
Figure 16C:
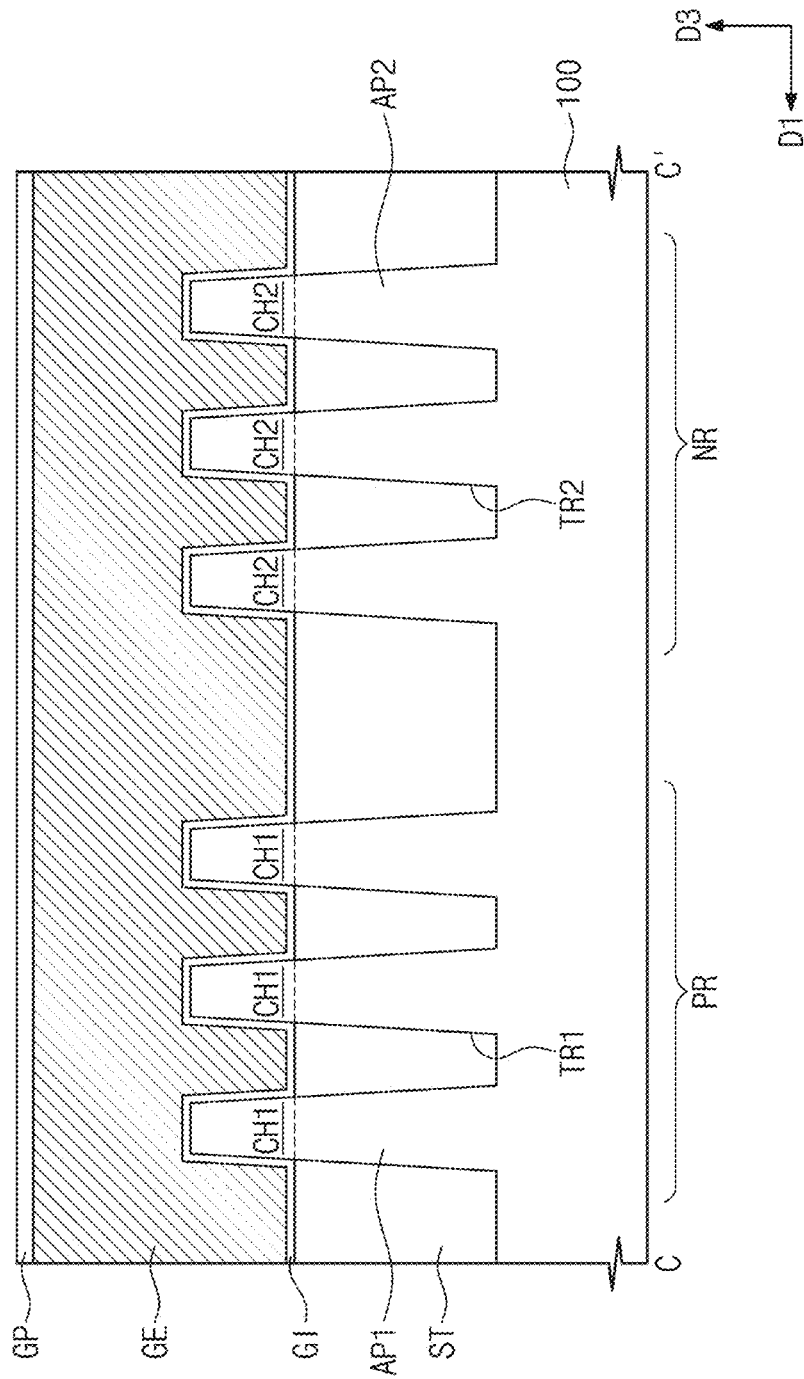
Figure 17:
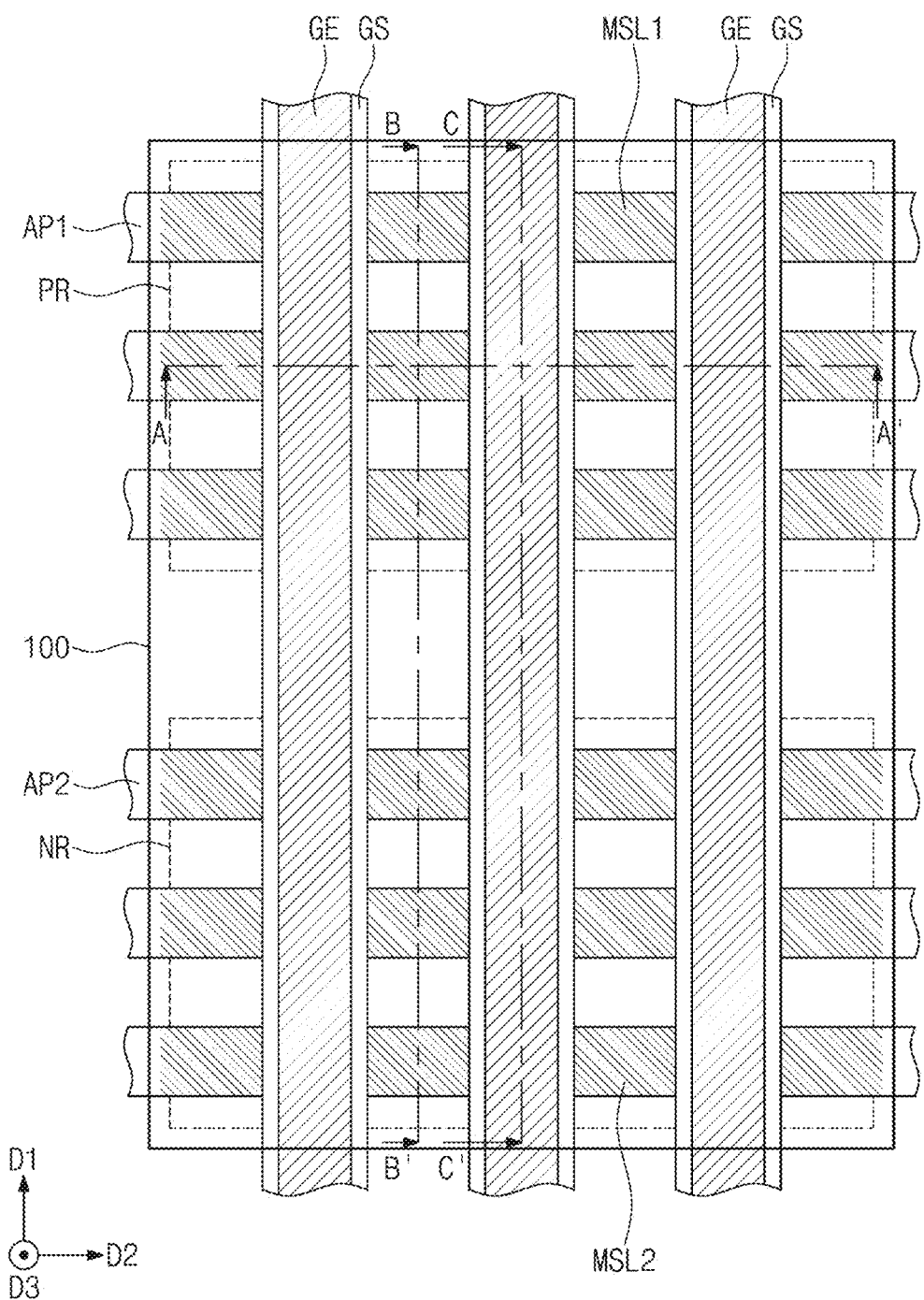
Figure 18A:
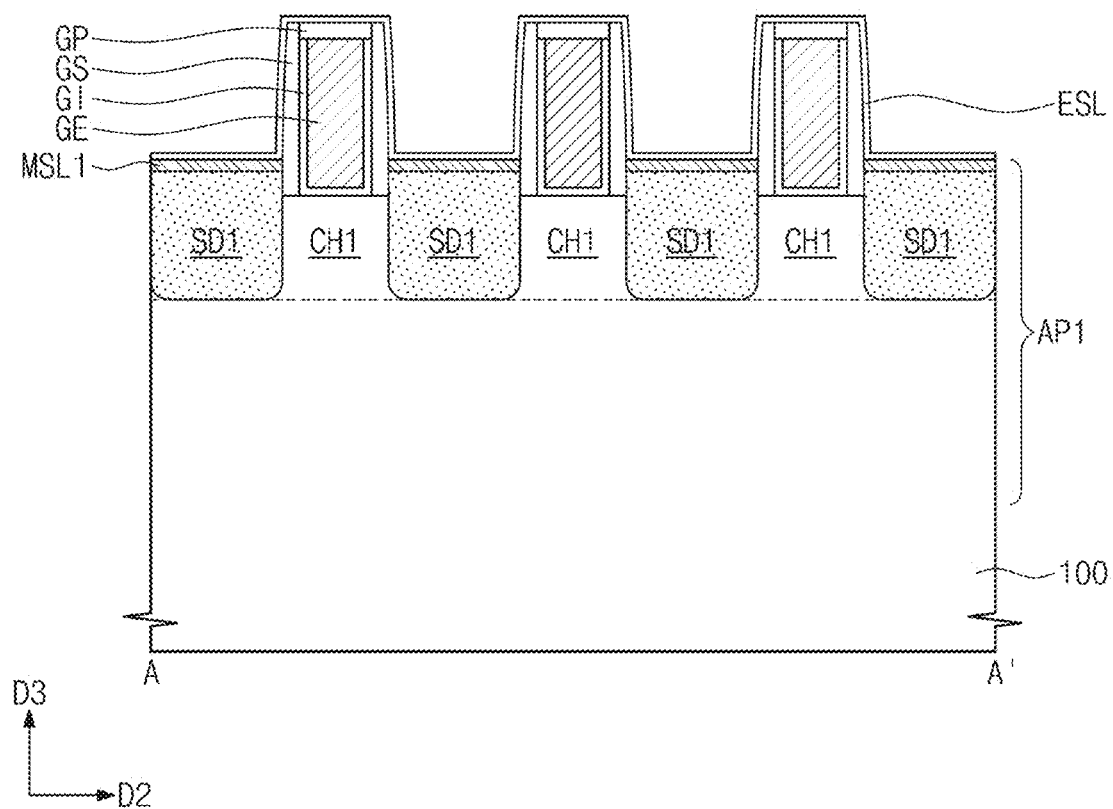
Figure 18B:
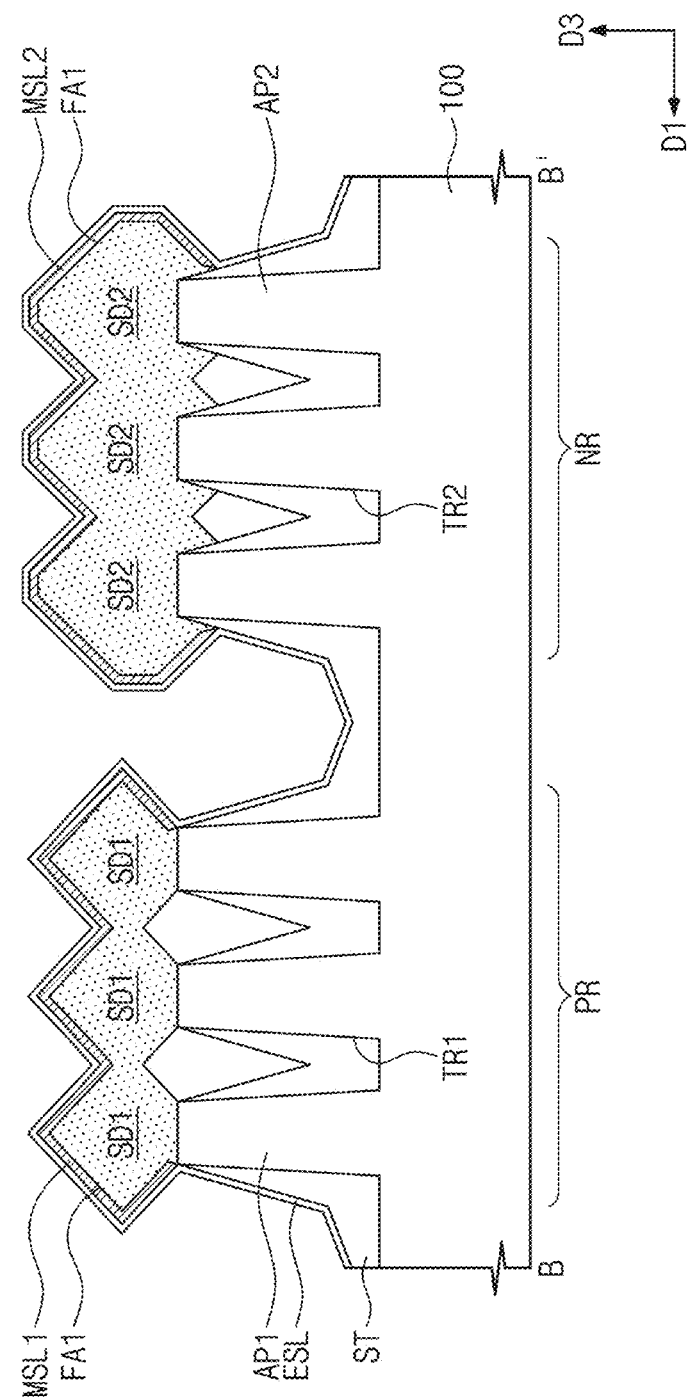
Figure 18C:
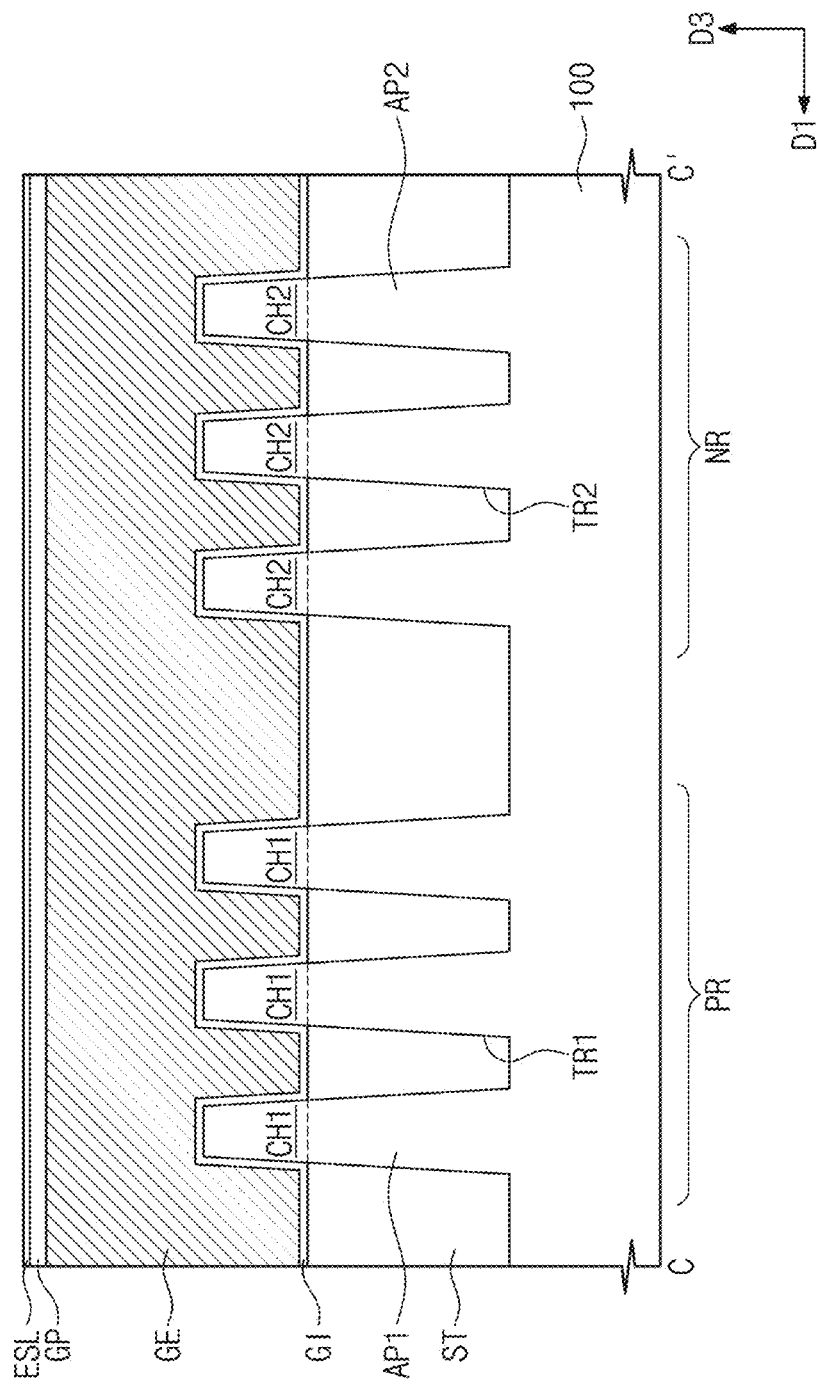
Figure 19:
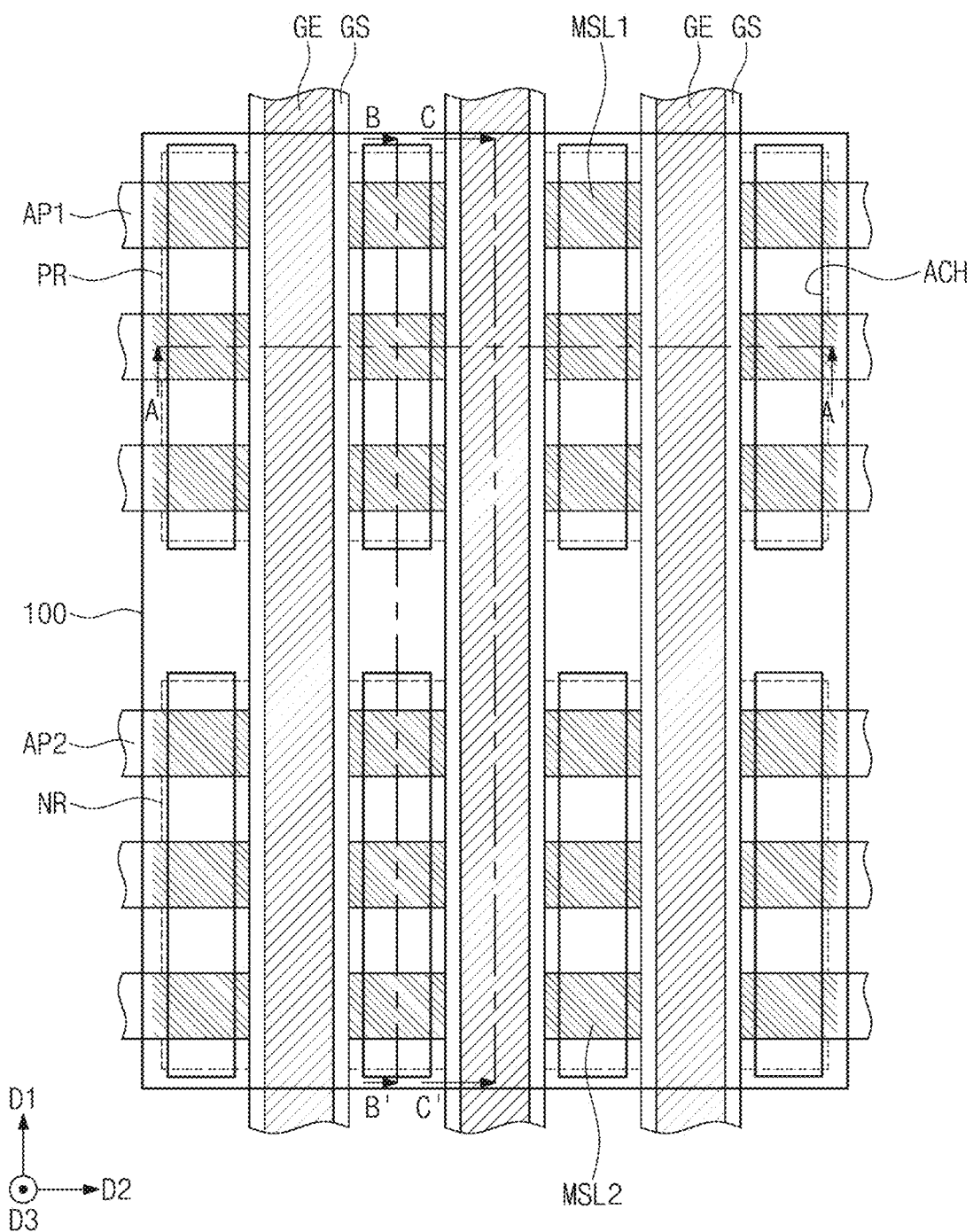
Figure 20A:
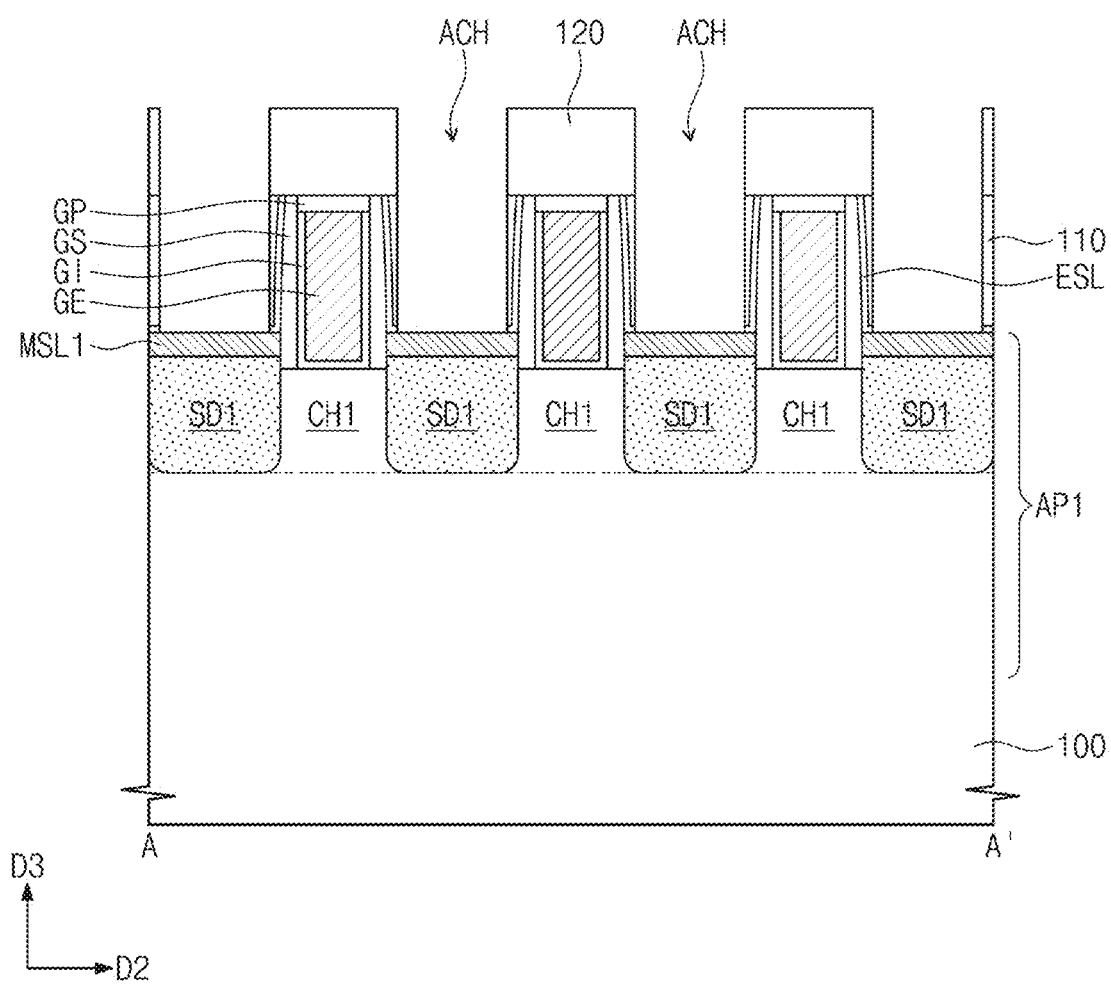
Figure 20B:
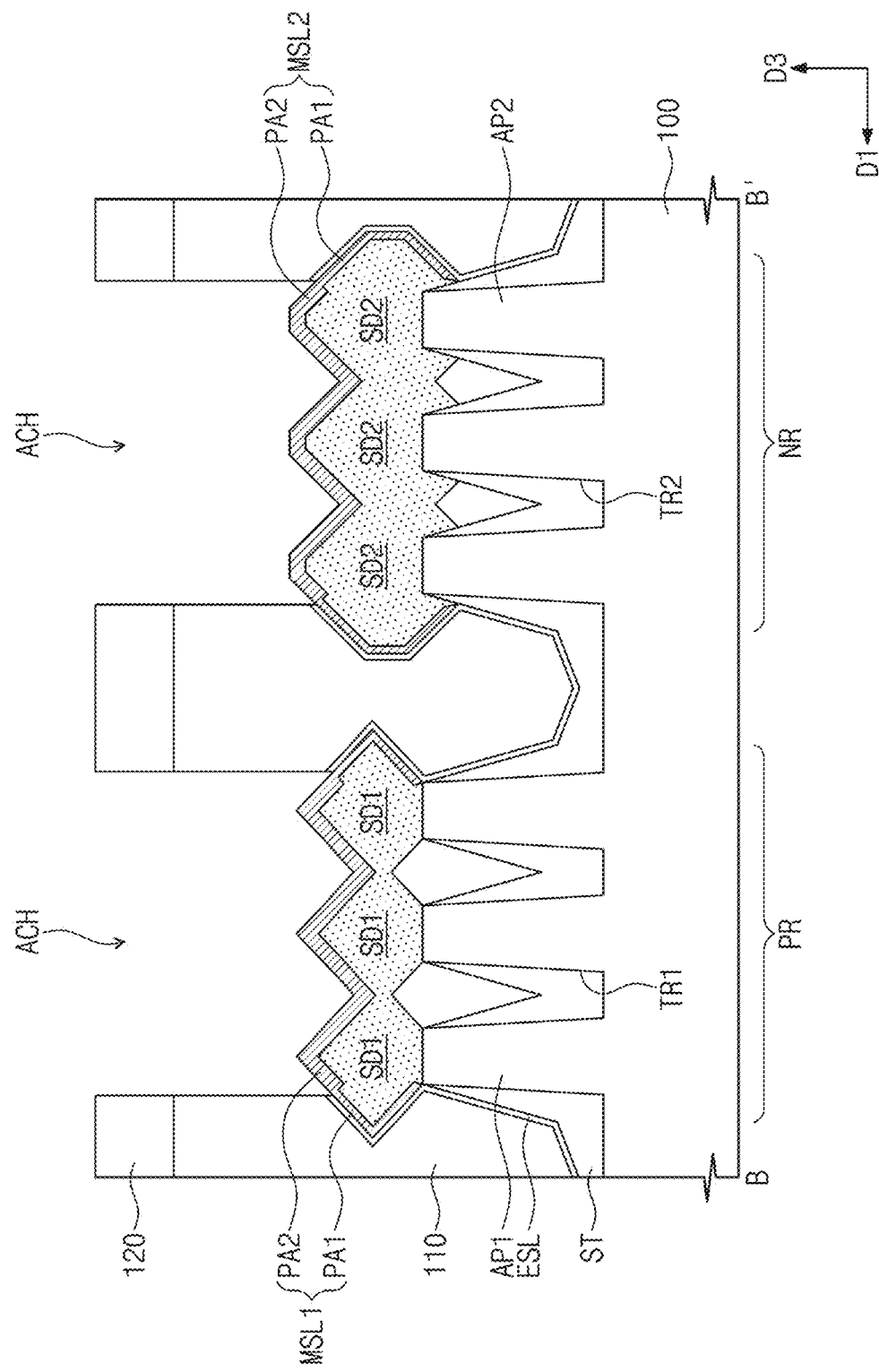
Figure 20C:
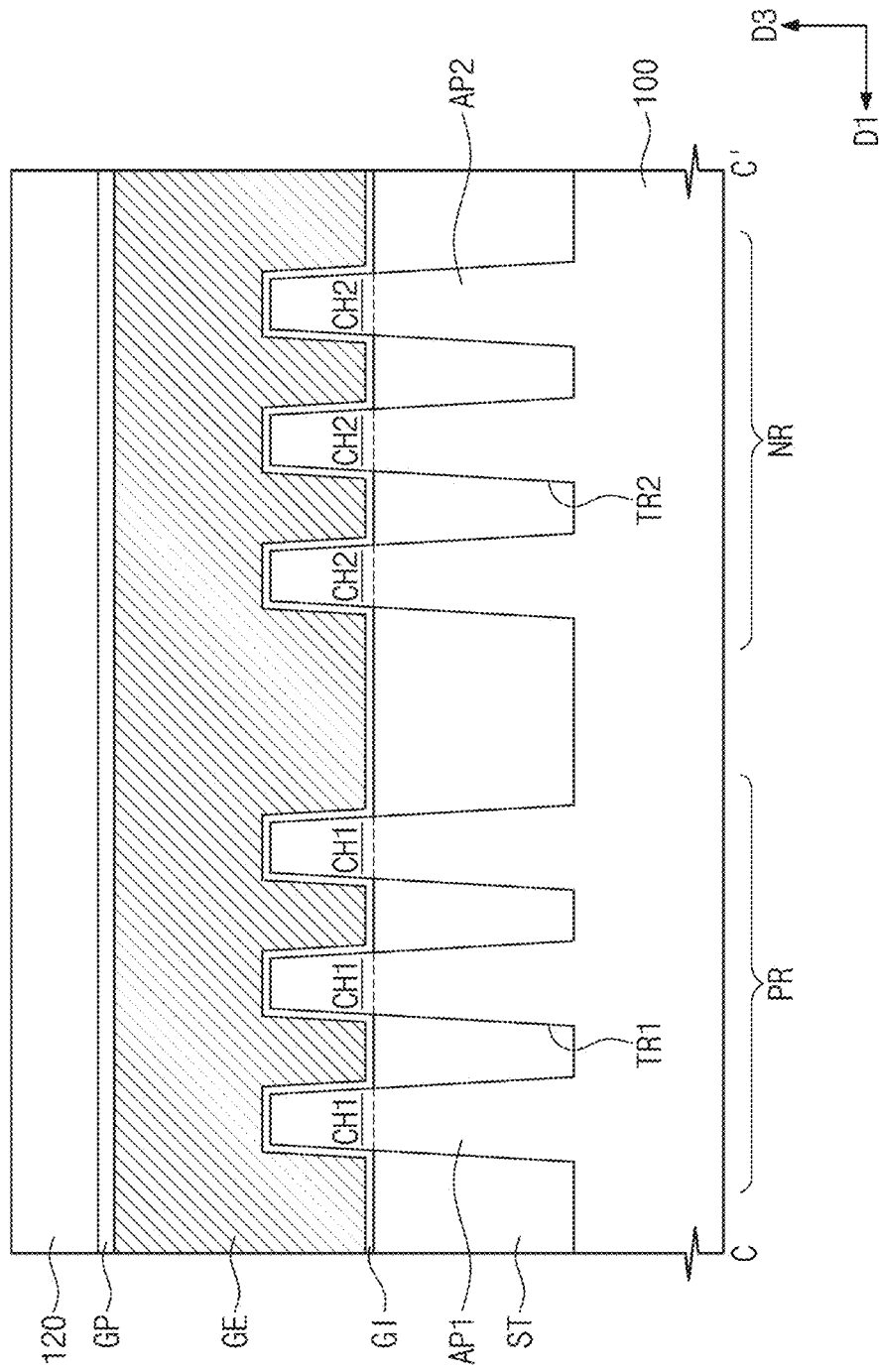

Referring to FIGS. 9, 10A, and 10B, the substrate 100 may be patterned to form the first and second active patterns AP1 and AP2. For example, the formation of the first and second active patterns AP1 and AP2 may include forming mask patterns on the substrate 100 and anisotropically etching the substrate 100 using the mask patterns as an etch mask. The first trenches TR1 may be formed between the first active patterns AP1. The second trenches TR2 may be formed between the second active patterns AP2. The substrate 100 may be a semiconductor substrate (e.g., of silicon, germanium, or silicon-germanium) or a compound semiconductor substrate. As an example, the substrate 100 may be a silicon wafer.

The device isolation layers ST may be formed to fill the first and second trenches TR1 and TR2. For example, an insulating layer (e.g., a silicon oxide layer) may be formed to fill all of the first and second trenches TR1 and TR2. Thereafter, the insulating layer may be recessed to expose upper portions of the first and second active patterns AP1 and AP2. The first active patterns AP1 may constitute the PMOSFET region PR, and the second active patterns AP2 may constitute the NMOSFET region NR.

Referring to FIGS. 11 and 12A to 12C, sacrificial patterns PP may be formed to cross the first and second active patterns AP1 and AP2. Each of the sacrificial patterns PP may be a line- or bar-shaped structure extending in the first direction D1. For example, the formation of the sacrificial patterns PP may include forming a sacrificial layer on the substrate 100, forming hard mask patterns 145 on the sacrificial layer, and patterning the sacrificial layer using the hard mask patterns 145 as an etch mask. The sacrificial layer may be formed of or include a poly-silicon layer.

A pair of the gate spacers GS may be formed on opposite side surfaces of each of the sacrificial patterns PP. The formation of the gate spacers GS may include conformally forming a spacer layer on the substrate 100 and anisotropically etching the spacer layer. The spacer layer may be formed of or include at least one of SiCN, SiCON, or SiN. In certain embodiments, the spacer layer may be a multi-layered structure including at least two of SiCN, SiCON, or SiN.

Referring to FIGS. 13 and 14A to 14C, the first source/drain patterns SD1 may be formed at both sides of each of the sacrificial patterns PP on the PMOSFET region PR. In detail, the recesses RS may be formed by etching upper portions of the first active patterns AP1 using the hard mask patterns 145 and the gate spacers GS as an etch mask. A selective epitaxial growth process may be performed to form the first source/drain patterns SD1, and inner side surfaces of the recesses RS of the first active patterns AP1 may be used as a seed layer in the selective epitaxial growth process. As a result of the formation of the first source/drain patterns SD1, a first channel region CH1 may be defined between a pair of the first source/drain patterns SD1. During the selective epitaxial growth process, three first source/drain patterns SD1, which are placed adjacent to each other in the first direction D1, may be merged to constitute a single first source/drain pattern SD1. As an example, the selective epitaxial growth process may include a chemical vapor deposition (CVD) process or a molecular beam epitaxy (MBE) process.

Each of the first source/drain patterns SD1 may be formed of or include a second semiconductor material whose lattice constant is larger than that of a first semiconductor material of the substrate 100. For example, the first semiconductor material may be silicon, and the second semiconductor material may be germanium. Each of the first source/drain patterns SD1 may be a multi-layered structure including a plurality of semiconductor layers.

The second source/drain patterns SD2 may be formed at both sides of each of the sacrificial patterns PP on the NMOSFET region NR. In example embodiments, recesses may be formed by etching upper portions of the second active patterns AP2 using the hard mask patterns 145 and the gate spacers GS as an etch mask. A selective epitaxial growth process may be performed to form the second source/drain patterns SD2, and inner side surfaces of the recesses of the second active patterns AP2 may be used as a seed layer in the selective epitaxial growth process. As a result of the formation of the second source/drain patterns SD2, a second channel region CH2 may be defined between a pair of the second source/drain patterns SD2. During the selective epitaxial growth process, three second source/drain patterns SD2, which are placed adjacent to each other in the first direction D1, may be merged to constitute a single second source/drain pattern SD2. As an example, the second source/drain patterns SD2 may be formed of or include silicon.

The first source/drain patterns SD1 and the second source/drain patterns SD2 may be sequentially formed by different processes. For example, the first source/drain patterns SD1 and the second source/drain patterns SD2 may not be formed at the same time.

Referring to FIGS. 15 and 16A to 16C, an insulating layer ILD may be formed to cover the first and second source/drain patterns SD1 and SD2, the hard mask patterns 145, and the gate spacers GS. As an example, the insulating layer ILD may be formed of or include silicon oxide.

Thereafter, the insulating layer ILD may be planarized to expose the top surfaces of the sacrificial patterns PP. The planarization of the insulating layer ILD may be performed using an etch-back or chemical mechanical polishing (CMP) process. During the planarization process, all of the hard mask patterns 145 may be removed. As a result, the insulating layer ILD may have a top surface that is substantially coplanar with the top surfaces of the sacrificial patterns PP and the gate spacers GS.

The exposed sacrificial patterns PP may be replaced with the gate electrodes GE.

The process of replacing the sacrificial patterns PP with the gate electrodes GE may include selectively removing the exposed sacrificial patterns PP to form empty spaces and sequentially forming the gate dielectric pattern GI, the gate electrode GE, and the gate capping pattern GP in each of the empty spaces.

The gate dielectric pattern GI may be conformally formed by an atomic layer deposition (ALD) process or a chemical oxidation process. As an example, the gate dielectric pattern GI may be formed of or include at least one of high-k dielectric materials. For example, the high-k dielectric materials may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The formation of the gate electrode GE may include forming a gate electrode layer to fill the empty space, from which the sacrificial pattern PP is removed, and planarizing the gate electrode layer. As an example, the gate electrode layer may be formed of or include at least one of conductive metal nitrides (e.g., titanium nitride or tantalum nitride) or metallic materials (e.g., titanium, tantalum, tungsten, copper, or aluminum).

Upper portions of the gate electrodes GE may be recessed. The gate capping patterns GP may be formed on the gate electrodes GE. The gate capping patterns GP may be formed to fully fill regions formed by recessing the gate electrodes GE. The gate capping patterns GP may be formed of or include at least one of SiON, SiCN, SiCON, or SiN.

Referring to FIGS. 17 and 18A to 18C, the insulating layer ILD may be selectively removed, and thus, the first and second source/drain patterns SD1 and SD2 may be exposed. The first metal silicide layer MSL1 may be formed by performing a silicidation process on the exposed first source/drain pattern SD1. The first metal silicide layer MSL1 may be formed to have a uniform thickness on the first surface FA1 of the first source/drain pattern SD1. The second metal silicide layer MSL2 may be formed by performing a silicidation process on the exposed second source/drain pattern SD2. The second metal silicide layer MSL2 may be formed to have a uniform thickness on the first surface FA1 of the second source/drain pattern SD2.

In some example embodiments, the first metal silicide layer MSL1 and the second metal silicide layer MSL2 may be formed simultaneously by the same silicidation process. In some example embodiments, the first metal silicide layer MSL1 and the second metal silicide layer MSL2 may be sequentially formed by different silicidation processes.

The thickness of the first metal silicide layer MSL1 on the first surface FA1 of the first source/drain pattern SD1 may be equal to or different from the thickness of the second metal silicide layer MSL2 on the first surface FA1 of the second source/drain pattern SD2. The first metal silicide layer MSL1 and the second metal silicide layer MSL2 may be formed using the same metal element or different metal elements. As an example, the first metal silicide layer MSL1 and the second metal silicide layer MSL2 may be formed of or include each independently at least one of titanium silicide, tantalum silicide, tungsten silicide, nickel silicide, or cobalt silicide.

The etch stop layer ESL may be conformally formed on the substrate 100. The etch stop layer ESL may be formed to directly cover the first and second metal silicide layers MSL1 and MSL2. The etch stop layer ESL may be formed of or include silicon nitride.

Referring to FIGS. 19 and 20A to 20C, the first interlayered insulating layer 110 may be formed to cover the first and second source/drain patterns SD1 and SD2 and the first and second metal silicide layers MSL1 and MSL2. The second interlayered insulating layer 120 may be formed on the first interlayered insulating layer 110. As an example, the first and second interlayered insulating layers 110 and 120 may be formed of or include silicon oxide.

Contact holes ACH may be formed to penetrate the second interlayered insulating layer 120 and the first interlayered insulating layer 110 and to expose the first and second source/drain patterns SD1 and SD2. The formation of the contact holes ACH may be performed using an etching process of selectively etching the first and second interlayered insulating layers 110 and 120. The etch stop layer ESL may be used to protect the first and second source/drain patterns SD1 and SD2 and the first and second metal silicide layers MSL1 and MSL2 from the etching process. The etch stop layer ESL covering the first and second metal silicide layers MSL1 and MSL2 may be removed during or after the etching process.

The first portion PA1 of the first metal silicide layer MSL1 may be covered with the etch stop layer ESL, whereas as a result of the removal of the etch stop layer ESL, the second portion PA2 of the first metal silicide layer MSL1 may be exposed to the contact hole ACH. A surface treatment process may be performed on the second portion PA2 of the first metal silicide layer MSL1, and as a result, the second portion PA2 of the first metal silicide layer MSL1 may have a thickness that is different from that of the first portion PA1.

In some example embodiments, the surface treatment process may include a thermal treatment process. In the case where the surface treatment process is the thermal treatment process, the thickness of the second portion PA2 of the first metal silicide layer MSL1 may be greater than that of the first portion PA1 (e.g., see FIG. 3). In some example embodiments, the surface treatment process may include an etching process. In the case where the surface treatment process is the etching process, the thickness of the second portion PA2 of the first metal silicide layer MSL1 may be less than that of the first portion PA1 (e.g., see FIG. 4). In some example embodiments, the surface treatment process may be an additional silicidation process. A metal element, which is different from a metal element for the first metal silicide layer MSL1, may be used for the additional silicidation process. In this case, the second portion PA2 of the first metal silicide layer MSL1 may be formed to have a double-layered structure (e.g., see FIG. 5).

The first portion of the second metal silicide layer MSL2 may be covered with the etch stop layer ESL, whereas as a result of the removal of the etch stop layer ESL, the second portion of the second metal silicide layer MSL2 may be exposed to the contact hole ACH. A surface treatment process may be performed on the second portion of the second metal silicide layer MSL2, and as a result, the second portion of the second metal silicide layer MSL2 may have a thickness that is different from that of the first portion. The surface treatment process on the second metal silicide layer MSL2 may be performed in substantially the same manner as the afore-described surface treatment process on the first metal silicide layer MSL1.

In some example embodiments, the surface treatment process on the first metal silicide layer MSL1 may be performed simultaneously with the surface treatment process on the second metal silicide layer MSL2. In some example embodiments, the surface treatment processes on the first and second metal silicide layers MSL1 and MSL2 may be performed sequentially by different methods. For example, the surface treatment process on the first metal silicide layer MSL1 may be a thermal treatment process, and the surface treatment process on the second metal silicide layer MSL2 may be an etching process.

Referring back to FIGS. 7 and 8A to 8C, the contacts AC may be formed in the contact holes ACH to be in contact with the first and second source/drain patterns SD1 and SD2. The formation of the contacts AC may include forming the barrier layer 160 to partially fill each of the contact holes ACH and forming the conductive pillar 165 to fully fill each of the contact holes ACH provided with the barrier layer 160.

In some example embodiments, since the surface treatment process is performed on the second portion PA2 of each of the first and second metal silicide layers MSL1 and MSL2, it may be possible to reduce electric resistance between the contacts AC and the first and second metal silicide layers MSL1 and MSL2.

Figure 21:
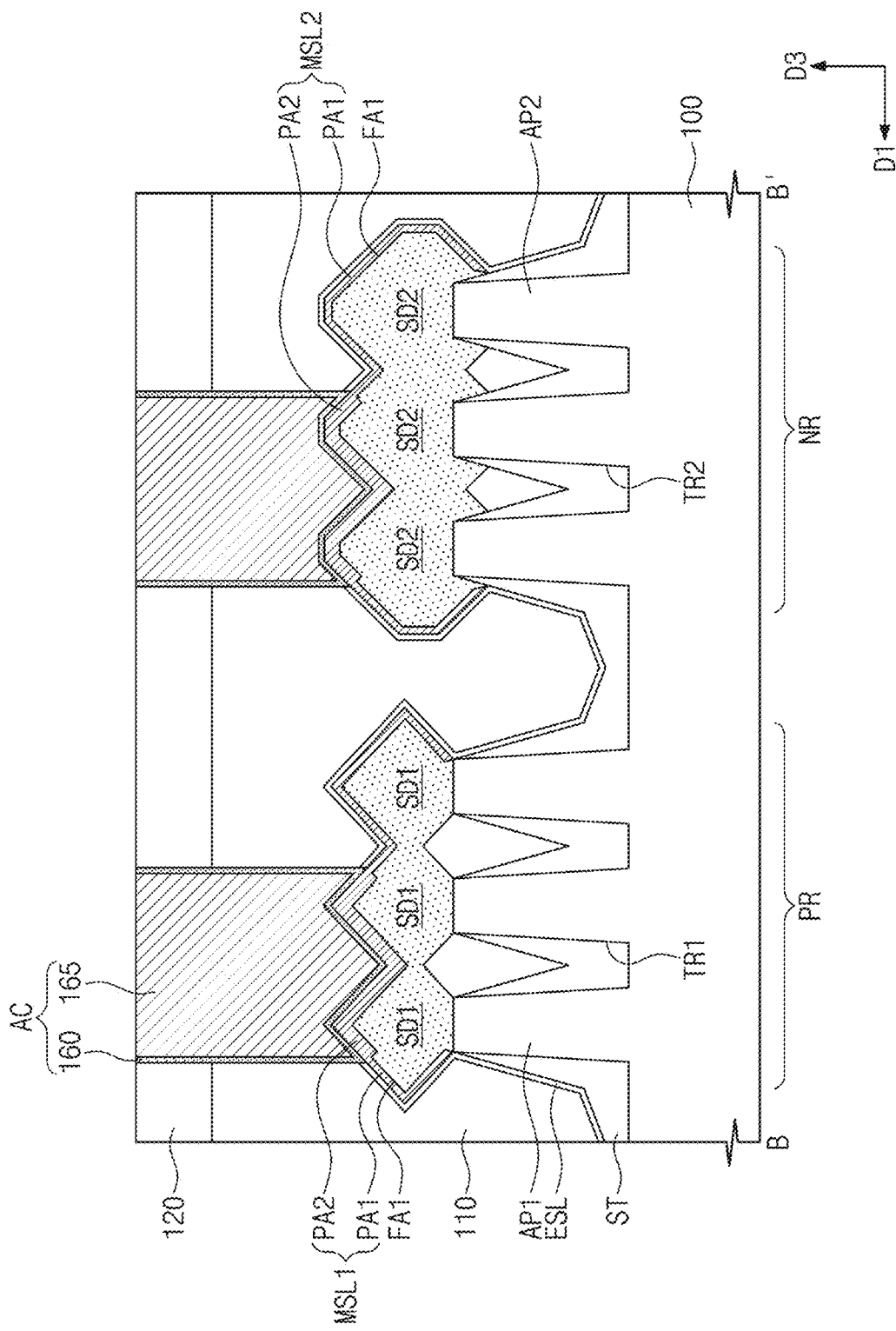
FIGS. 21 and 22 are sectional views, which are taken along line B-B' of FIG. 7 to illustrate semiconductor devices according to some example embodiments of the inventive concepts.
Figure 22:
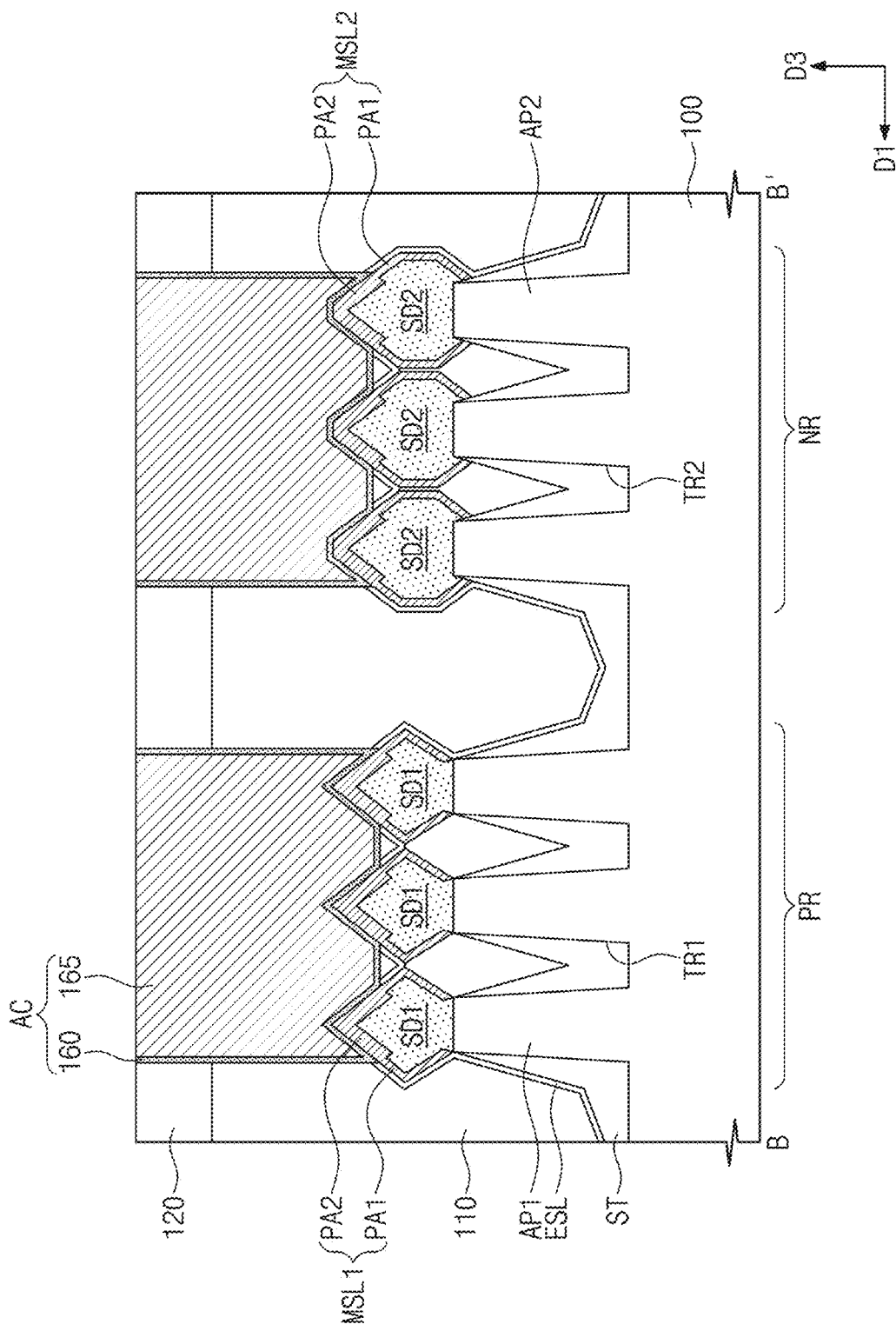

FIGS. 21 and 22 are sectional views, which are taken along line B-B' of FIG. 7 to illustrate semiconductor devices according to some example embodiments of the inventive concepts. For concise description, an element previously described with reference to FIGS. 7 and 8A to 8C may be identified by the same reference number without repeating a description thereof.

Referring to FIGS. 7, 8A, 8C, and 21, the contact AC may be provided to be electrically connected to each of the first and second source/drain patterns SD1 and SD2. At least one of three first active patterns AP1 under the first source/drain pattern SD1 may not be vertically overlapped with the contact AC connected to the first source/drain pattern SD1. For example, the third one of the first active patterns AP1 may not be vertically overlapped with the contact AC connected to the first source/drain pattern SD1.

At least one of three second active patterns AP2 under the second source/drain pattern SD2 may not be vertically overlapped with the contact AC connected to the second source/drain pattern SD2. For example, the third one of the second active patterns AP2 may not be vertically overlapped with the contact AC connected to the second source/drain pattern SD2.

The first portion PA1 of the first metal silicide layer MSL1 may be provided to cover the first source/drain pattern SD1 located on the third one of the first active patterns AP1. The first portion PA1 of the second metal silicide layer MSL2 may be provided to cover the second source/drain pattern SD2 located on the third one of the second active patterns AP2.

In some example embodiments, a contact area between the contact AC and the metal silicide layer MSL1 or MSL2 may be reduced, compared with the previous embodiment of FIG. 8B. However, the first portion PA1 of the metal silicide layer MSL1 or MSL2 may cover a portion of the source/drain pattern SD1 or SD2, which is not overlapped with the contact AC. This may make it possible to reduce electric resistance between the contact AC and the source/drain pattern SD1 or SD2.

Referring to FIGS. 7, 8A, 8C, and 22, the first source/drain patterns SD1, which are arranged adjacent to each other in the first direction D1, may not be merged and may be separated from each other. The second source/drain patterns SD2, which are arranged adjacent to each other in the first direction D1, may not be merged and may be separated from each other.

The first metal silicide layer MSL1 may be provided on each of the first source/drain patterns SD1, and the second metal silicide layer MSL2 may be provided on each of the second source/drain patterns SD2. Each of the first metal silicide layers MSL1 may include the first portion PA1 covered with the etch stop layer ESL and the second portion PA2 covered with the contact AC. Each of the second metal silicide layers MSL2 may include the first portion PA1 covered with the etch stop layer ESL and the second portion PA2 covered with the contact AC.

According to some example embodiments of the inventive concepts, a semiconductor device may include a metal silicide layer, allowing a contact and a source/drain pattern to be connected to each other with an increased contact area and/or a reduced resistance. Accordingly, the semiconductor device may have improved electric characteristics (e.g., operation speed).

While example embodiments of the inventive concepts have been particularly shown and described, it will be understood by one of ordinary skill in the art that variations in form and detail may be made therein without departing from the spirit and scope of the attached claims.

What is claimed is:
1. A semiconductor device, comprising:
a substrate comprising first active patterns, the first active patterns vertically protruding from a top surface of the substrate;

a first channel pattern on each of the first active patterns, the first channel pattern including a plurality of semiconductor patterns that are vertically stacked and spaced apart from each other;

first source/drain patterns on the first active patterns, the first source/drain patterns being merged with each other to form one first source/drain pattern;

a first metal silicide layer on the first source/drain pattern, the first metal silicide layer comprising a first portion and a second portion, the first portion on a side portion of the first source/drain pattern, the second portion on a top portion of the first source/drain pattern;

a first contact electrically connected to the first source/drain pattern through the second portion of the first metal silicide layer; and an etch stop layer covering the first portion of the first metal silicide layer, wherein a thickness of the first portion of first metal silicide layer is different from a thickness of the second portion of first metal silicide layer.

2. The semiconductor device of claim 1, wherein the second portion of first metal silicide layer is vertically overlapped with the first contact, and the first portion of first metal silicide layer is spaced apart from the first contact.

3. The semiconductor device of claim 1, wherein the plurality of semiconductor patterns are connected to the first source/drain pattern.

4. The semiconductor device of claim 1, further comprising a gate electrode on the first channel pattern, wherein the gate electrode surrounds top, bottom, and opposite side surfaces of at least one of the plurality of semiconductor patterns.

5. The semiconductor device of claim 1, wherein the first source/drain pattern includes a first surface on the side portion of the first source/drain pattern, a second surface on the same side portion of the first source/drain pattern, and a vertex where the first surface and the second surface meet each other, and wherein the first portion covers the vertex.

6. The semiconductor device of claim 1, wherein the thickness of the first portion of first metal silicide layer is less than the thickness of the second portion of first metal silicide layer.

7. The semiconductor device of claim 1, wherein a metal element in the first portion of first metal silicide layer is different from a metal element in the second portion of first metal silicide layer.

8. The semiconductor device of claim 1, wherein the second portion of the first metal silicide layer comprises a first silicide pattern and a second silicide pattern on the first silicide pattern.

9. The semiconductor device of claim 1, further comprising:

second active patterns vertically protruding from the top surface of the substrate;

second source/drain patterns on the second active patterns, the second source/drain patterns being merged with each other to form one second source/drain pattern;

a second metal silicide layer on the second source/drain pattern; and a second contact electrically connected to the second source/drain pattern through the second metal silicide layer, wherein the first and second source/drain patterns have conductivity types different from each other, and a thickness of the second metal silicide layer, which is vertically overlapped with the second contact, is different from a thickness of the second portion of the first metal silicide layer.

10. The semiconductor device of claim 9, wherein the first and second source/drain patterns have different shapes.

11. The semiconductor device of claim 9, wherein a metal element in the first metal silicide layer is different from a metal element in the second metal silicide layer.

12. A semiconductor device, comprising:

a substrate with a PMOSFET region and an NMOSFET region;

a plurality of first active patterns on the PMOSFET region and second active patterns on the NMOSFET region;

a first source/drain pattern on the plurality of first active patterns and a second source/drain pattern on the plurality of second active patterns;

a first channel pattern on each of the plurality of first active patterns and a second channel pattern on each of the plurality of second active patterns, each of the first and second channel patterns including a plurality of semiconductor patterns that are vertically stacked and spaced apart from each other;

a first metal silicide layer and a second metal silicide layer on the first and second source/drain patterns, respectively; and first and second contacts in contact with the first and second metal silicide layers, respectively, wherein each of the first and second metal silicide layers includes:

a first portion on an upper portion of a corresponding one of the first and second source/drain patterns; and a second portion on the upper portion and between a corresponding one of the first and second contacts and the corresponding one of the first and second source/drain patterns, wherein a thickness of the second portion of the first metal silicide layer is different from a thickness of the second portion of the second metal silicide layer.

13. The semiconductor device of claim 12, wherein the first and second portions substantially do not overlap each other.

14. The semiconductor device of claim 12, wherein the first portion of each of the first and second metal silicide layers is directly covered with an insulating material.

15. The semiconductor device of claim 12, wherein the first and second source/drain patterns have different shapes.

16. The semiconductor device of claim 12, further comprising a gate electrode on the first and second channel patterns, wherein the gate electrode surrounds top, bottom, and opposite side surfaces of at least one of the plurality of semiconductor patterns.

17. The semiconductor device of 22, wherein a thickness of the first portion of the first metal silicide layer is different from the thickness of the second portion of the first metal silicide layer.

18. The semiconductor device of claim 12, wherein a thickness of the first portion of the second metal silicide layer is different from the thickness of the second portion of the second metal silicide layer.

19. The semiconductor device of claim 12, wherein a metal element in the first metal silicide layer is different from a metal element in the second metal silicide layer.

20. The semiconductor device of claim 12, wherein the plurality of semiconductor patterns of the first channel pattern are connected to the first source/drain pattern, and the plurality of semiconductor patterns of the second channel pattern are connected to the second source/drain pattern.

\* \* \* \* \*